US012222240B2

(12) United States Patent
Woodruff et al.

(10) Patent No.: US 12,222,240 B2
(45) Date of Patent: *Feb. 11, 2025

(54) PROTECTIVE MASK FOR AN OPTICAL RECEIVER

(71) Applicant: Luminar Technologies, Inc., Orlando, FL (US)

(72) Inventors: Justin Robert Woodruff, Orlando, FL (US); Stephen L. Mielke, Oviedo, FL (US); Roger S. Cannon, Oviedo, FL (US)

(73) Assignee: Luminar Technologies, Inc., Orlando, FL (US)

( * ) Notice: Subject to any disclaimer, the term of this patent is extended or adjusted under 35 U.S.C. 154(b) by 385 days.

This patent is subject to a terminal disclaimer.

(21) Appl. No.: 17/529,786

(22) Filed: Nov. 18, 2021

(65) Prior Publication Data
US 2022/0390274 A1 Dec. 8, 2022

Related U.S. Application Data

(63) Continuation-in-part of application No. 17/336,585, filed on Jun. 2, 2021, now Pat. No. 11,953,722.

(51) Int. Cl.
*G01J 1/04* (2006.01)
*G01S 7/4861* (2020.01)

(52) U.S. Cl.
CPC ........... *G01J 1/0437* (2013.01); *G01S 7/4861* (2013.01)

(58) Field of Classification Search
CPC .......... G01J 1/06; G01J 1/0214; G01J 1/0437; G01J 1/0204; G01J 1/0433; G01J 1/44; G01J 2001/4466; G01J 2001/4238; G01S 7/4816; G01S 7/4861; G01S 7/4813; G01S 17/42; H01L 31/0203; H01L 31/1075

See application file for complete search history.

(56) References Cited

U.S. PATENT DOCUMENTS

| | | | |
|---|---|---|---|
| 9,258,463 B2* | 2/2016 | Mitsui | H10K 39/32 |
| 2002/0052088 A1 | 5/2002 | Okamoto et al. | |
| 2003/0146384 A1* | 8/2003 | Logsdon | H01L 23/10 |
| | | | 250/338.1 |

(Continued)

FOREIGN PATENT DOCUMENTS

EP 1347637 3/2003

OTHER PUBLICATIONS

Takagi "Plasma Cleaning Device", Jun. 12, 2001, JP2001158979A (Year: 2001).*

(Continued)

*Primary Examiner* — Sang H Nguyen
(74) *Attorney, Agent, or Firm* — Van Pelt, Yi & James LLP

(57) ABSTRACT

An optical receiver including an ASIC, a light detector element, and a protective mask is disclosed. The light detector element is disposed on the ASIC and has a top surface oriented toward incident light, the top surface including a portion configured to receive the incident light and via which the incident light reaches an active area of the light detector element. The protective mask is placed over the ASIC so as to (i) cover, from the incident light, a portion of the ASIC, and (ii) provide an aperture that defines an optical path for the incident light through the protective mask to the portion of the top surface of the light detector element.

37 Claims, 13 Drawing Sheets

(56) References Cited

U.S. PATENT DOCUMENTS

| | | | |
|---|---|---|---|
| 2004/0012872 A1 | 1/2004 | Fleming et al. | |
| 2005/0212929 A1* | 9/2005 | Schell | H01L 27/14618 |
| | | | 348/340 |
| 2005/0242059 A1* | 11/2005 | Brennen | B23K 26/066 |
| | | | 156/345.19 |
| 2006/0000964 A1 | 1/2006 | Ye et al. | |
| 2009/0294542 A1 | 12/2009 | Rogy et al. | |
| 2011/0146771 A1* | 6/2011 | Chuang | H01L 31/072 |
| | | | 257/14 |
| 2012/0146170 A1* | 6/2012 | Vigier-Blanc | H01L 27/14683 |
| | | | 257/432 |
| 2013/0037831 A1 | 2/2013 | Rudmann et al. | |
| 2014/0361200 A1 | 12/2014 | Rudmann et al. | |
| 2017/0052277 A1* | 2/2017 | Wong | H01L 25/167 |
| 2017/0123101 A1 | 5/2017 | Luan | |
| 2017/0151546 A1 | 6/2017 | Peck et al. | |
| 2018/0286909 A1 | 10/2018 | Eichenholz et al. | |
| 2018/0329065 A1* | 11/2018 | Pacala | H01L 31/02162 |
| 2020/0051873 A1 | 2/2020 | Sano et al. | |

OTHER PUBLICATIONS

Carey "Thin Sacrificial Masking Films For Protecting Semiconductors From Pulsed Laser Process", Jun. 15, 2011, CN 102099898A (Year: 2011).*

Cotteverte et al "Method Of Making A Photonic Crystal", Dec. 15, 1999, EP 0964305A1 (Year: 1999).*

Non-Final Office Action dated Jul. 31, 2023 for U.S. Appl. No. 17/336,585.

International Search Report and Written Opinion for PCT/US2022/031980 dated Sep. 8, 2022.

* cited by examiner

PROTECTIVE MASK FOR AN OPTICAL RECEIVER

REFERENCE TO RELATED APPLICATIONS

This application is a continuation-in-part of U.S. patent application Ser. No. 17/336,585, filed 2 Jun. 2021, the entire disclosure of which is incorporated by reference herein.

FIELD OF THE DISCLOSURE

The present disclosure generally relates to optical receivers and, more particularly, to a protective mask for an optical receiver.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Optical systems often include optical receivers configured to detect light. An optical receiver may include both photosensitive elements, such as photodiodes, and non-photosensitive elements, such as circuitry that receives output signals from photodiodes. In order for the optical receiver to function, light must be able to reach the light detection elements of the optical receiver. However, incoming light may be of such an intensity that it damages portions of the optical receiver.

SUMMARY

An optical receiver of this disclosure includes a protective mask placed so as to protect circuitry of the optical receiver without interfering with the optical path of incoming light to the light detection elements of the optical receiver. More particularly, the optical receiver may include a light detector element, such as an avalanche photodiode (APD), disposed on an application-specific integrated circuit (ASIC), such as a readout integrated circuit (ROIC). The top surface of the light detector element is oriented towards incident light, where at least a portion of the top surface of the light detector element is configured to receive incident light. Incident light reaches an active area (i.e., an area of the light detector element sensitive to incident light) of the light detector element via the portion of the top surface that receives the incident light. In some implementations, the active area of the light detector element is located at the top surface, such that the portion of the top surface corresponds to the active area. In other implementations, the active area of the light detector element is located at or near a bottom surface of the light detector element, such that incident light travels from the portion of the top surface through at least a portion of the light detector element to reach the active area.

The protective mask can be placed over the ASIC so as to cover, from incident light, at least a portion of the ASIC. The protective mask may further cover a portion of the top surface of the light detector element. However, the protective mask also includes an aperture that defines an optical path for incident light through the protective mask to the active area of the light detector element, or, said another way, to the active area via the portion of the top surface. The aperture allows incoming light having a particular optical path to still reach the active area. Thus, the protective mask protects regions of the ASIC and the light detector element susceptible to optical damage while allowing the optical receiver to detect light incoming along the particular optical path.

Further, the protective mask increases the accuracy of the optical receiver by minimizing the probability that light having a different optical path than the desired optical path can reach the active area. The light detector element may be configured to detect light incoming from a specific direction. For example, the optical receiver may be included in a light detection and ranging (lidar) system having more than one light detector. Light emitted by a light source of the lidar system and reflected back is steered by components of the lidar system to specific light detectors. If light that is steered to a first light detector reaches a second light detector instead (e.g., due to scattering effects), the light can interfere with the measurements of the second light detector, leading to erroneous distance analysis by the lidar system. The protective mask reduces these cross-talk errors by only allowing light incoming along a specific optical path (i.e., on-axis light) to reach the active area of the light detector.

Moreover, the geometric features of the protective mask can be tuned to enhance the ability of the protective mask to prevent off-axis light from reaching the active area. In some implementations, the aperture in the protective mask has a conical shape, where an opening on a top surface of the protective mask is wider than an opening on the bottom surface of the protective mask. In other implementations, the aperture in the protective mask has a conical shape, where an opening on the bottom surface of the protective mask is larger than an opening on the top surface of the protective mask. Further, in some implementations, the aperture is provided in a crater with a projected portion extending along the circumference of the aperture. Thus, the top surface of the protective mask is raised along the circumference of the aperture, forming a volcano-like shape that scatters off-axis light away from the aperture.

Depending on the implementation, a diameter of the aperture may be substantially equal to a diameter of the active area, or may be larger than a diameter of the active area. For example, if the top surface of the light detector is partially protected by a metallization layer, the aperture may be larger than the active area. However, the aperture is still small enough such that light cannot access the sides of the light detector element, where it could scatter towards the active area.

In addition, the protective mask can accommodate multiple light detector elements and/or a light detector element having more than one active area. For example, if multiple light detectors are disposed on an ASIC, the protective mask can have an aperture for each of the multiple light detectors. If a single light detector has two active areas, the protective mask can have (i) an aperture defining an optical path to each active area, or (ii) an aperture that defines an optical path including both of the active areas.

One example embodiment of these techniques is an optical receiver including an ASIC; a light detector element with a top surface oriented toward incident light, the top surface including a portion configured to receive the incident light and via which the incident light reaches an active area of the light detector element, the light detector element disposed on the ASIC; and a protective mask placed over the ASIC so as to (i) cover, from the incident light, a portion of the ASIC, and (ii) provide an aperture that defines an optical path for the incident light through the protective mask to the portion of the top surface of the light detector element.

Another example embodiment of these techniques is a mask for protecting an ASIC of an optical receiver. The mask includes a body including a raised portion configured to attach to a surface of the ASIC and a recessed portion to partially cover a top surface of a light detector element disposed on the ASIC, wherein the top surface is oriented toward incident light. The mask further includes an aperture to define an optical path extending through the mask to a portion of the top surface configured to receive the incident light.

Yet another example embodiment of these techniques is a lidar system including a light source configured to emit pulses of light, a scanner configured to scan the emitted pulses of light across a field of regard of the lidar system, an optical receiver configured to detect incident light including a portion of one of the emitted pulses of light scattered by a target located a distance from the lidar system, and a processor configured to determine the distance to the target based on a round-trip time of the portion of the emitted pulse of light, the round-trip time corresponding to a time between when the portion of the emitted pulse of light is emitted by the light source and when the portion of the emitted pulse of light is detected by the optical receiver. The optical receiver includes an ASIC; a light detector element with a top surface oriented toward the incident light, the top surface including a portion configured to receive the incident light and via which the incident light reaches an active area of the light detector element, the light detector element disposed on the ASIC; and a protective mask placed over the ASIC so as to (i) cover, from the incident light, at least a portion of the ASIC, and (ii) provide an aperture that defines an optical path for the incident light through the protective mask to the portion of the top surface of the light detector element.

DETAILED DESCRIPTION

Figure 1:
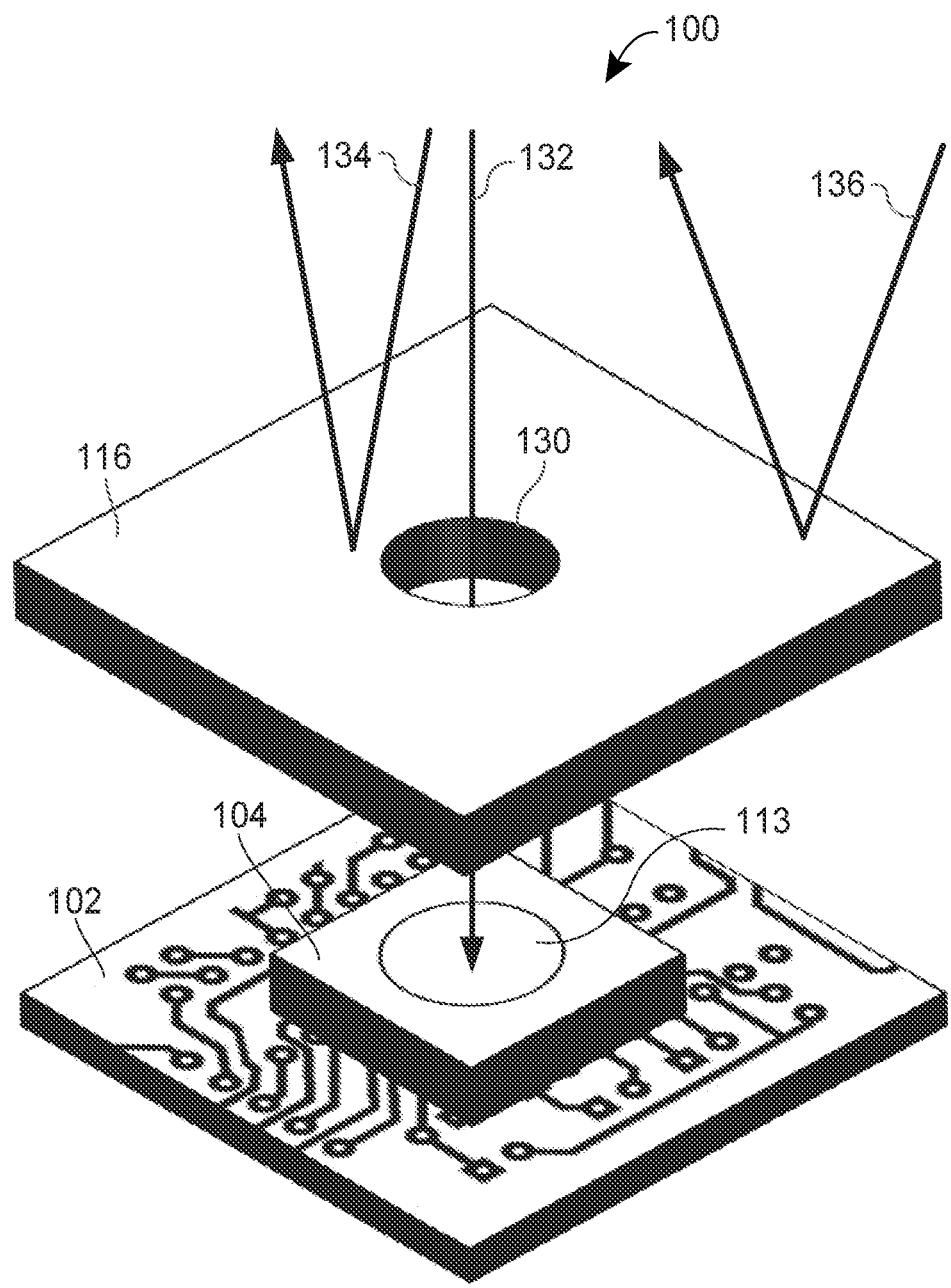
FIG. 1 schematically illustrates a portion of an example optical receiver including a protective mask for an application-specific integrated circuit (ASIC) having a light detector element disposed thereon, the protective mask placed over the ASIC and including an aperture so as to allow light having a particular optical path to reach an active area of the light detector element.

FIG. 1 schematically illustrates how a protective mask of this disclosure protects parts of an optical receiver susceptible to damage without interfering with the light detection functions of the optical receiver. A portion 100 of an example optical receiver includes a mask 116 and an application-specific integrated circuit (ASIC) 102 having a light detector 104 disposed thereon. The optical receiver may be an optical receiver of a lidar system, as will be discussed below with reference to FIG. 8. Additional details regarding the ASIC 102, which may be a readout integrated circuit (ROIC), and the light detector 104, which may be an avalanche photodiode (APD), are discussed in further detail below with reference to FIGS. 6A-7.

A top surface of the light detector 104 includes an area 113 that receives incident light. For example, the top surface of the light detector 104 excluding the area 113 may correspond to an upper electrode or metallization layer through which light cannot pass. Incident light that is received at the area 113 can reach, via the area 113, an active area of the light detector element. The active area is the region of the light detector 104 that detects light (i.e., the region that is photosensitive). In some implementations, the area 113 corresponds to the active area. Such light detector configurations may be referred to as front-side illuminated. In other implementations, the active area is located below or opposite the area 113. For example, the substrate of the light detector 104 may be transparent to incident light. As a result, incident light that reaches the area 113 travels through the substrate to reach the active area. Such light detector configurations may be referred to as back-side illuminated. Front- and back-side illuminated configurations are discussed below with reference to FIGS. 6A-6B.

The mask 116 includes an aperture 130 that defines an optical path through the mask 116 to the area 113. Because incident light can reach the active area of the light detector 104 via the area 113, the aperture 130 can also be described as an aperture 130 that defines an optical path through the mask 116 to the active area of the light detector 104. The mask 116 thereby allows incident light having a specific optical path to reach the area 113 and prevents incident light that does not have the specific optical path from reaching the area 113. For example, if the portion 100 is included in an optical receiver of a lidar system, components of the lidar system may steer received light pulses to the optical receiver along a particular optical path. The mask 116 allows incident light having this particular optical path to reach the area 113. If other light not having this particular optical path reaches the optical receiver, the mask 116 prevents this other light from reaching the area 113. This other light may originate from scattering of light within the optical receiver or housing of the lidar system, or from other light sources of the lidar system not configured to be detected by the light detector 104.

In FIG. 1, a light beam 132 travels along the optical path defined by the aperture 130. The light beam 132 passes through the mask 116 via the aperture 130 to the area 113. In contrast, the mask 116 prevents light beams 134, 136 from reaching the area 113. The light beam 134, for example, has an optical path that, without the mask 116, would reach the light detector 104 but not the area 113. The mask 116 prevents the light beam 134 from striking the portion of the top surface of the light detector 104 that is not configured to receive light. Thus, the mask 116 prevents damage to light detector 104. In addition, the mask 116 prevents light from reaching portions of the light detector 104 that may scatter the light, which could then scatter back towards the active area of the light detector 104 off other portions of the optical receiver and cause erroneous detections by the light detector 104. Similarly, the light beam 136 has an optical path that, without the mask 116, would reach the ASIC 102. The mask 116 prevents the light beam 136 from striking and causing damage to the ASIC 102, and prevents the light beam 136 from scattering off the ASIC 102.

The properties of the mask 116 may vary by implementation. The mask 116 may have a high optical damage threshold (e.g., a laser damage threshold or laser-induced damage threshold) such that the mask 116 is resistant to damage and ablation by incident light. For example, if the optical receiver including the mask 116 is included in a lidar system having one or more lasers, the mask 116 may be resistant to damage (e.g., relative to the light detector 104 and the ASIC 102) caused by laser pulses reflected back to the optical receiver. A laser-induced damage threshold of the mask 116 may be above 10 joules per square centimeter, for example.

In addition, the mask 116 may have optical properties suitable for the implementation. The mask 116 may be opaque to incident light having wavelengths to which the light detector 104 is sensitive. For example, the light detector 104 may be photosensitive to light having wavelengths between approximately 1500-1600 nanometers (nm), and the mask 116 may be opaque to light having wavelengths between 1500-1600 nm. In such an example, the mask 116 prevents incident light having a wavelength of 1550 nm, for example, from reaching the light detector 104 unless the incident light has an optical path through the aperture 130. In some implementations, the mask 116 absorbs incident light (e.g., incident light in the visible spectrum and/or incident light having wavelengths to which the light detector 104 is sensitive). Additionally or alternatively, the mask 116 may reflect or scatter incident light (e.g., incident light in the visible spectrum and/or incident light having wavelengths to which the light detector 104 is sensitive).

The mask 116 may be a monolithic, rigid component (i.e., a one-piece structure) and may be made from, for example, a polyimide material, an injection-molded polymer, a metal, or suitable type of ceramic material, such as an engineered ceramic, a silicate-based ceramic, a nitride-based ceramic, silicon carbide (SiC), or alumina. If the mask 116 is made from metal, such as aluminum or steel, the mask 116 may have a non-conductive coating. For example, a metal mask 116 may have a black-anodized aluminum coating.

Further, the top surface of the mask 116 may have different textures and/or shapes based on the implementation. As will be discussed in further detail with reference to FIG. 3, the top surface of the mask 116 may be raised along the circumference of the aperture 130, or have another suitable shape, for reflecting incident light away from the aperture 130. The shape of the top surface of the mask 116 may be configured to scatter light in a direction where the light will be absorbed by another component of the optical receiver and/or where the light is unlikely to scatter back towards to the aperture 130. The top surface of the mask 116 may be smooth or rough, depending on the implementation.

Figure 2:
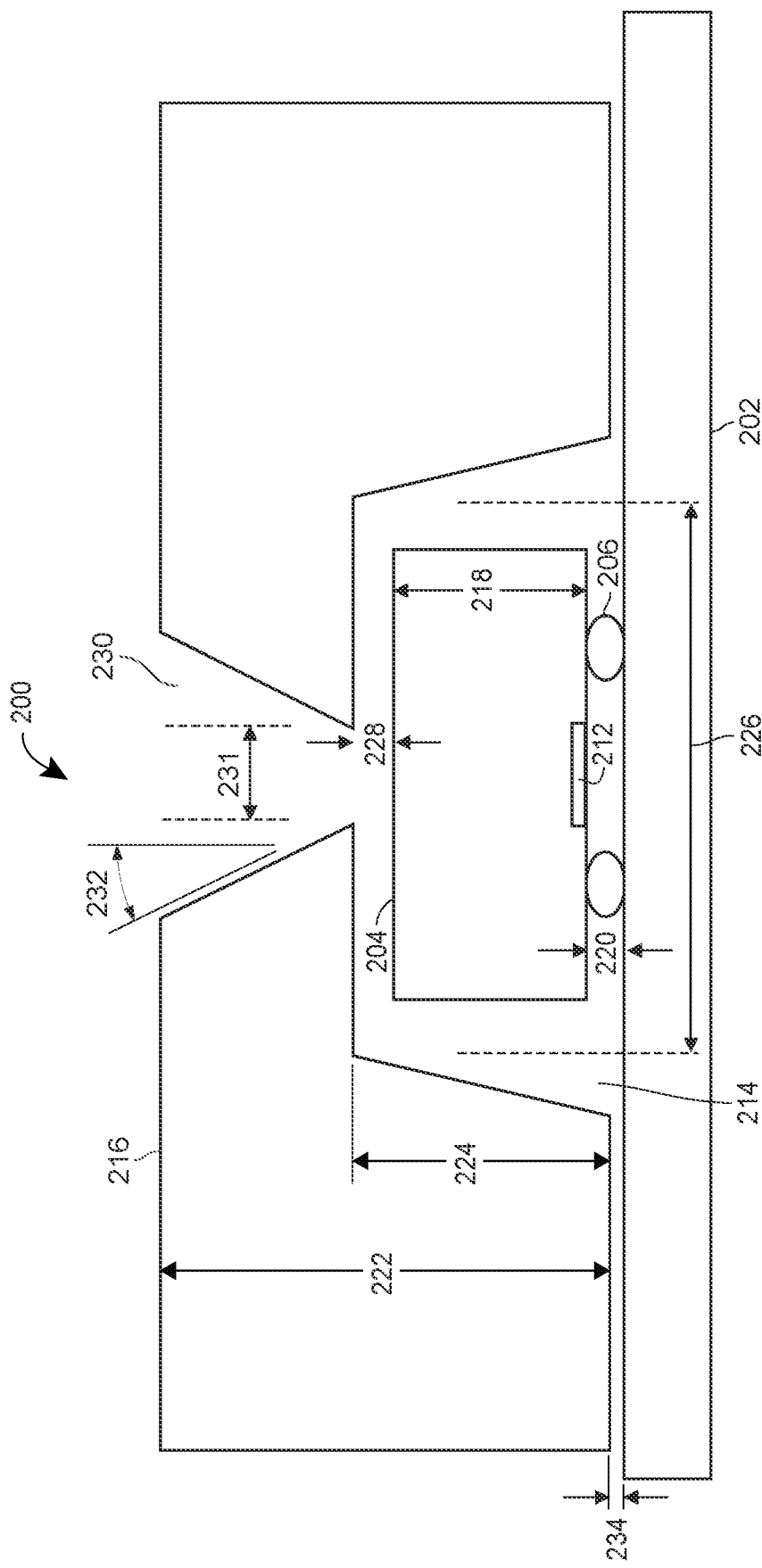
FIG. 2 illustrates a side view of an example optical receiver including an ASIC, light detector element, and protective mask having an aperture.

FIG. 2 illustrates a cross-sectional side view of an example optical receiver 200. The portion 100 of FIG. 1 may be a portion of the optical receiver 200. The optical receiver 200 includes an ASIC 202 and a light detector 204. The light detector 204 is electrically connected to the ASIC 202 via connections 206, which may be bump-bonds, as described below with reference to FIG. 6B. A mask 216 is placed over the ASIC 202 and the light detector 204 so as to cover at least a portion of the ASIC 202 and at least a portion of the light detector 204. The surface area of the top surface of the mask 216 may be sufficient to cover the ASIC 202 (or at least a portion of the ASIC 202 susceptible to light damage) and at least a portion of the light detector 204. To accommodate the light detector 204, the mask 216 includes a cavity 214. Thus, the mask 216 may be described as having a raised portion, having a thickness 222, and a recessed portion, having a thickness equal to the thickness 222 minus a height 224 of the cavity 214. The raised portion of the mask 216 is the portion of the mask 216 that may be attached (e.g., with epoxy or adhesive) directly to the ASIC 202.

The light detector 204 has an active area 212 that detects light. The mask 216 is placed over the ASIC 202 and the light detector 204 such that an aperture 230 of the mask 216 is aligned with the active area 212. For example, a center of the aperture 230 may be substantially aligned with a center of the active area 212. The aperture 230 defines an optical path for incident light through the protective mask to the top surface of the light detector 204. More specifically, the optical path is through the protective mask to a portion of the top surface of the light detector configured to receive light (e.g., the area 113 of FIG. 1). Via this portion of the top surface, the light can reach active area 212, where the light detector 204 detects the incident light. As will be discussed with reference to FIGS. 6A-6B, in some implementations, the active area 212 is located at the top surface of the light detector 204 rather than at the bottom surface.

As mentioned above with reference to FIG. 1, the mask 216 may be a monolithic, rigid component. Accordingly, the light detector 204 may be mounted on the ASIC 202, and then the mask 216 can be placed, in one step, over the light detector 204 and the ASIC 202. When placing the mask 216 over the light detector 204 and the ASIC 202, the aperture 230 is aligned over the active area 212. Epoxy and/or adhesive may be placed on the ASIC 202 and/or the mask 216 to affix the mask 216 to the ASIC 202.

In some implementations, there may be more than one light detector mounted on the ASIC 202. For each light detector, the mask 216 can include a separate aperture. Accordingly, the mask 216 may include 1, 2, 3, 4, or any other suitable number of apertures corresponding to the number of light detectors mounted on the ASIC 202. Each aperture defines an optical path to a portion of the top surface of a corresponding light detector, through which light reaches the active area of the corresponding light detector. Alternatively or in addition, a single light detector may have more than one active area, where light reaches each active area via a different respective portion of the top surface of the light detector. In such implementations, a single aperture may be large enough to include optical paths to the multiple active areas (i.e., to the multiple active areas via the corresponding portions of the top surface of the light detector). Alternatively, there may be multiple apertures corresponding to the respective active areas of the light detector.

The components of the optical receiver 200 may have the following dimensions. It should be understood that the dimensions of this disclosure are exemplary, and that the light detector 204, the ASIC 202, and the mask 216 may have any suitable dimensions. Generally speaking, the size of the mask 216 reflects the size of the ASIC 202 and the light detector 204. A height 218 of the light detector 204 may be approximately 50-300 micrometers (μm). A distance 220 between the bottom surface of the light detector 204 and the ASIC 202 (i.e., the height of the connectors 206) may be approximately 5-50 μm. A distance 234 between the bottom surface of the mask 216 and the ASIC 202 may be approximately 1-50 μm. The distance 234 corresponds to a gap between the mask 216 and the ASIC 202. An epoxy or adhesive may be located in the gap and may be configured to affix the mask 216 to the ASIC 202.

A width 231 of the aperture 230 may be approximately 25-1,000 μm. The width 231 of the aperture 230 may be approximately equal or larger than the width of the active area 212. In some implementations, the aperture 230 is circular, such that the width 231 of the aperture 230 is a diameter of the aperture 230. Similarly, the active area 212 may also be circular, where the diameter of the active area 212 may be approximately or substantially equal to the diameter 231, or smaller than the diameter 231. However, the aperture 230 may be any suitable shape. For example, the size and shape of the aperture 230 may be approximately equal to the size and shape of the active area 212. Further, in some implementations, the aperture 230 has a conical shape, where an opening on the top surface of the mask 216 is wider than the opening on the bottom surface of the mask 216. In such implementations, an angle 232 between a central axis of the aperture and a side of the aperture may be approximately 10-20°.

Figure 19:
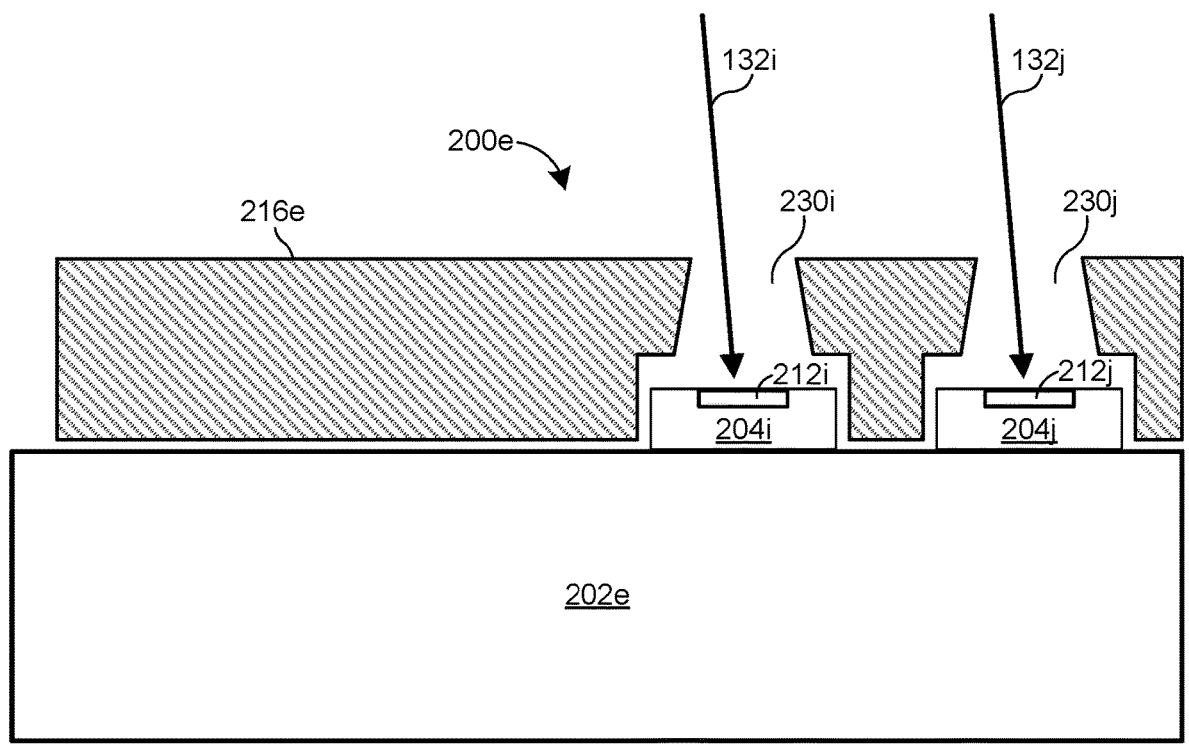
FIG. 19 illustrates a side view of an example optical receiver that includes the protective mask of FIG. 18.

A width 226 of the cavity 214 may be approximately 300-500 μm. Because the cavity 214 should accommodate the light detector 204, the width 226 may depend on the dimensions of the light detector 204. The sides of the cavity 214 may be slanted, such that the cavity 214 is narrower near the top of the light detector 204 than at the bottom of the light detector 204, as shown in FIG. 2. Alternatively, the sides of the cavity 214 may be approximately orthogonal to the top surface of the ASIC (e.g., as illustrated in FIG. 19). The height 224 of the cavity 214 should be larger than the height 218 of the light detector 204, and may be approximately 100-300 μm. The thickness 222 of the protective mask may be approximately 200-1,000 μm.

Figure 3:
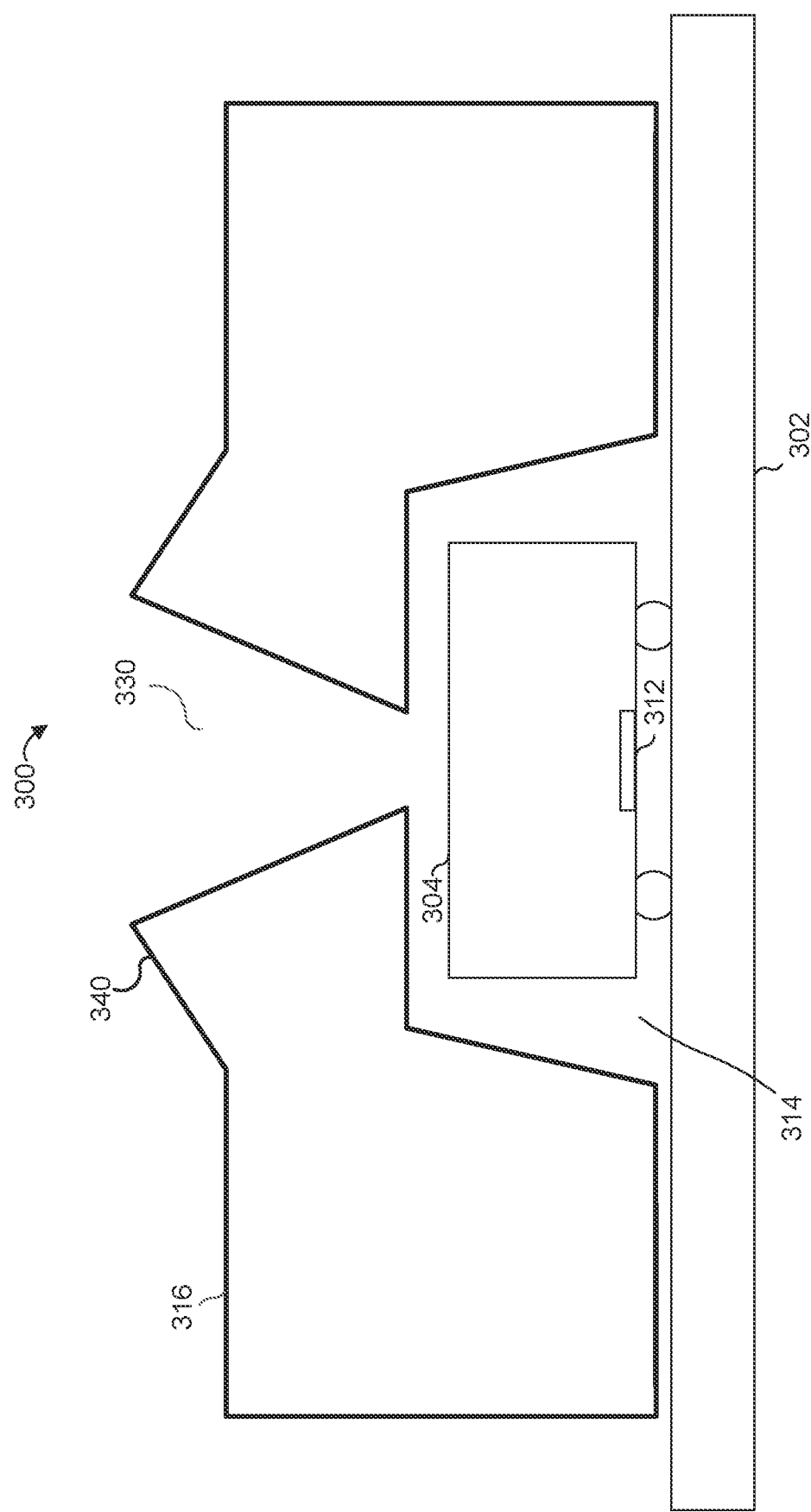
FIG. 3 illustrates a side view of an example optical receiver similar to the optical receiver of FIG. 2, but where the top surface of the protective mask is raised along the circumference of the aperture.

In FIG. 2, the top surface of the mask 216 is flat. However, turning to FIG. 3, a top surface of another example mask 316 may be shaped in order to scatter light away from an aperture 330. FIG. 3 illustrates a cross-sectional side view of an example optical receiver 300. With the exception of the top surface of the mask 316, the mask 316 is similar to the mask 216. Similar to FIG. 2, the mask 316 is placed over an ASIC 302 having a light detector 304 mounted thereon. A cavity 314 of the mask 316 accommodates the light detector 304. The aperture 330 is aligned with an active area 312 of the light detector 304. The top surface of the mask 316 includes a scattering feature 340. In FIG. 3, the top surface of the mask 316 is raised along the circumference of the aperture. The scattering feature 340 corresponds to this raised portion of the top surface of the mask 316. Because the aperture 330 may be circular, the resulting shape may resemble a volcano, with the aperture corresponding to a crater of the volcano.

Figure 4:
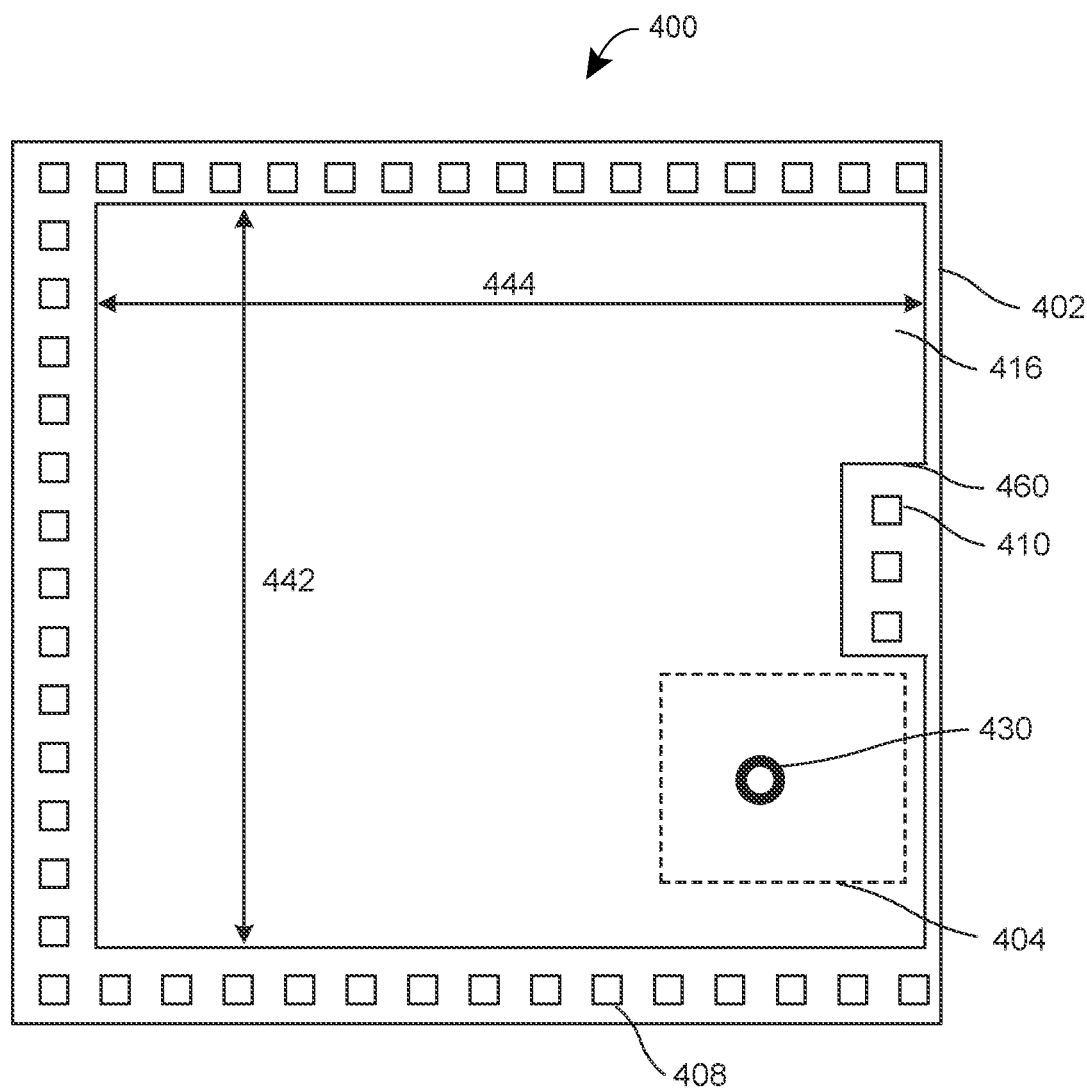
FIG. 4 illustrates a top view of an example protective mask that is placed on an ASIC having a light detector disposed thereon.

The scattering feature 340 may have any suitable shape for reflecting incident light that does not have an optical path through the aperture 330 away from the aperture 330. The angle at which the scattering feature 340 slopes upward from the top surface of the mask 316 may be selected to scatter incident light in a particular direction (e.g., to a region of the optical receiver where the light can be absorbed, or scattered in a way that is unlikely to reach the aperture 330). The top surface of the mask 316 may abruptly begin to slope upward, as shown in FIG. 3, or gradually begin to slope upward. Further, the slope of the scattering feature 340 may be constant, or may gradually steepen FIG. 4 illustrates a top view of an example optical receiver 400 including a mask 416 placed over an ASIC 402. The optical receiver 400 may be the optical receiver 200 or the optical receiver 300. A light detector 404 is attached to the top surface of the ASIC 402, and the mask 416 is placed over the ASIC 402 and the light detector 404 such that an aperture 430 of the mask 416 is aligned with an active area of the light detector 404. The outline of the light detector 404, which is below the mask 416, is represented by a dashed line in FIG. 4. If, in another implementation, the light detector 404 attaches to a different portion of the ASIC 402, then the aperture 430 will be in a different location of the mask 416 so as to align with the active area. The mask may have a height 442 and a width 444, which each may be approximately 1,500-3,000 μm, for example.

The ASIC 402 may include input/output (I/O) pads 408, 410 via which the ASIC 402 may be electrically connected to other components, such as other components (e.g., a processor or controller) of a lidar system including the optical receiver 400. The I/O pads 408, 410 may be arranged around the periphery of the ASIC 402. The mask 416 may be sized to cover most of the ASIC 402 (i.e., the circuitry of the ASIC 402) while leaving the I/O pads 408, 410 exposed. Wire connections can then be attached to the I/O pads 408, 410, depending on the implementation. In FIG. 4, the right side of the ASIC 402 has three I/O pads 410, but does not have other I/O pads. The mask 416 therefore extends closer to the right edge, or to the right edge, of the ASIC 402 and has a cutout 460 to allow the I/O pads 410 to remain uncovered by the mask 416. Depending on the implementation, if I/O pads 408, 410 will not be used, the mask 416 can also cover one or more of the I/O pads 408, 410.

Figure 5A:
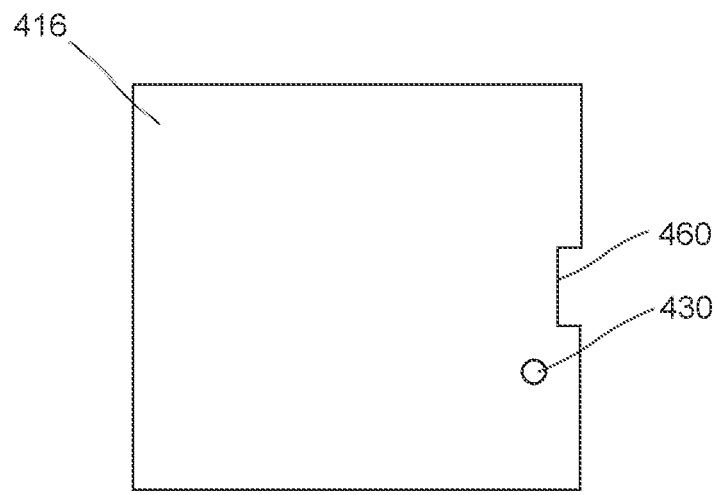
FIGS. 5A-5B illustrate a top view and a bottom view, respectively, of the example protective mask of FIG. 4 separate from the ASIC.
Figure 5B:
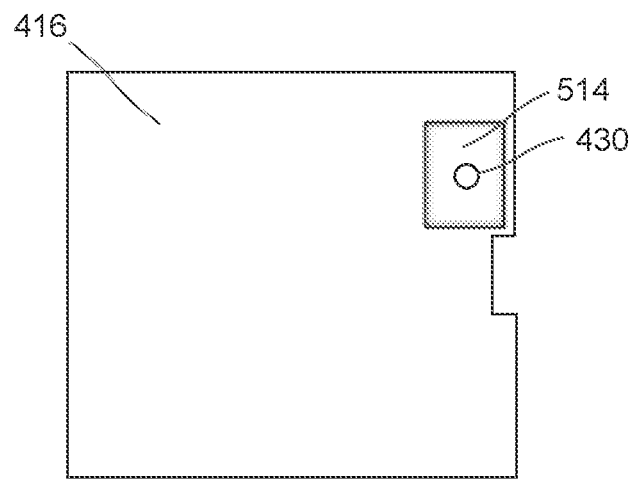

FIGS. 5A-5B illustrate the mask 416 of FIG. 4 from a top view and a bottom view, respectively, separate from the ASIC 402. As shown in FIG. 5B, the mask 416 includes a cavity 514 that accommodates the light detector 404.

FIGS. 1-5B illustrate a protective mask that that can be placed over an ASIC and light detector disposed on the ASIC. The following FIGS. 6-9 of this disclosure illustrate an example light detector, example circuitry of a light detection system including a light detector, and example lidar systems in which an optical receiver including a protective mask can operate.

Figure 6A:
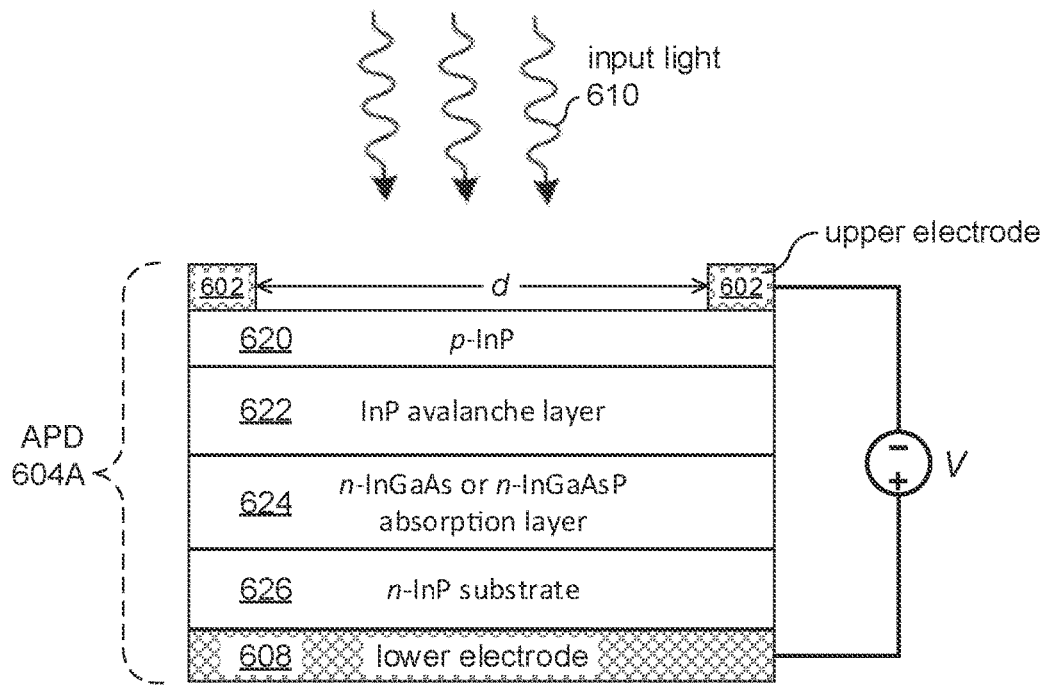
FIG. 6A illustrates an example front-side illuminated avalanche photodiode (APD), which can operate as a light detector element of an optical receiver.
Figure 6B:
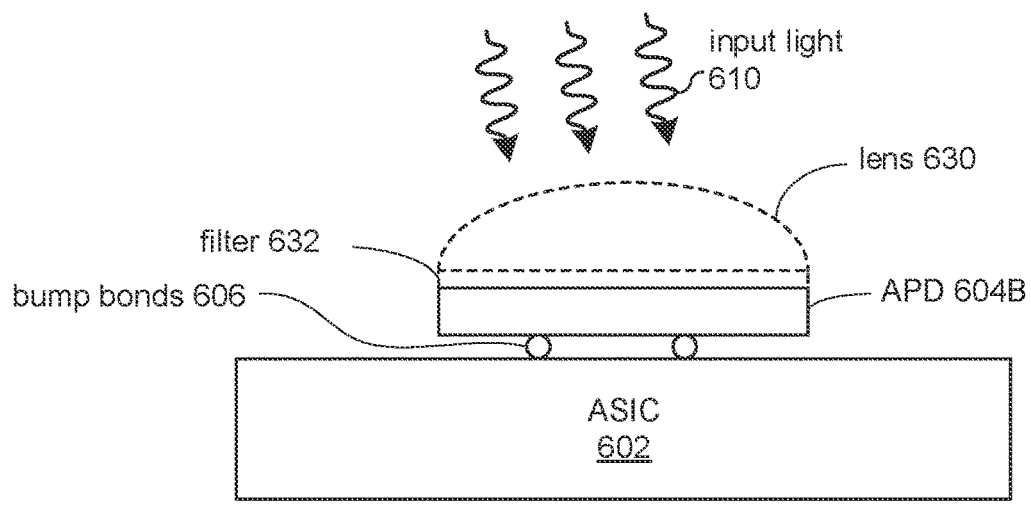
FIG. 6B illustrates an example back-side illuminated APD, which can operate as a light detector element of an optical receiver.

FIG. 6A illustrates an example InGaAs APD 604A in a front-side illuminated configuration. FIG. 6B illustrates an APD 604B in a back-side illuminated configuration. To ease readability, APD 604 is used herein to represent either the APD 604A or the APD 604B. Referring back to FIGS. 1-4, the APD 604 may be any one of the light detectors 104, 204, 304, 404. More generally, the APD 604 is configured to receive and detect light and may be included in any light detection system. For example, the APD 604 may be included in an optical receiver of a lidar system, such as the lidar system illustrated in FIG. 8, and may be configured to detect a portion of pulses of light which are scattered by a target located downrange from the lidar system. After detecting a pulse of light, the APD 604 may generate an electrical-current signal corresponding to the received pulse of light, as will be discussed in with reference to FIG. 7. While this disclosure primarily refers to light detectors corresponding to APDs, it should be understood that the protective mask of this disclosure can be used with other types of light detectors, such as photoresistors, phototransistors, and other types of photodiodes.

Turning first to FIG. 6A, the APD 604A may include doped or undoped layers of any suitable semiconductor material, such as for example, silicon, germanium, InGaAs, InGaAsP, or indium phosphide (InP). Additionally, the APD 604A may include an upper electrode 602 and a lower electrode 608 for coupling the ADP 604A to an electrical circuit. The APD 604A for example may be electrically coupled to a voltage source that supplies a reverse-bias voltage V to the APD 604A. Additionally, the APD 604A may be electrically coupled to a transimpedance amplifier which receives electrical current generated by the APD 604A and produces an output voltage signal that corresponds to the received current. The upper electrode 602 or lower electrode 608 may include any suitable electrically conductive material, such as for example a metal (e.g., gold, copper, silver, or aluminum), a transparent conductive oxide (e.g., indium tin oxide), a carbon-nanotube material, or polysilicon.

At least a portion of the top surface of the APD 604A is configured to receive incident light. Light received by this portion of the top surface of the APD 604A can reach an active area of the APD 604A that detects the incident light. The active area of the APD 604A corresponds to the portion of the APD 604A that is sensitive to the incident light. In the front-side illuminated APD 604A, the portion of the top surface of the APD 604A that receives the incident light includes the active area. In some implementations, the upper electrode 602 is partially transparent or has an opening to allow input light 610 to pass through to the active area of the APD 604A. In FIG. 6A, the upper electrode 602 may have a ring shape that at least partially surrounds the active area of the APD 604A. The active area may have any suitable size or diameter d, such as for example, a diameter of approximately 25 μm, 50 μm, 80 μm, 100 μm, 200 μm, 500 μm, 1 mm, 2 mm, or 5 mm.

The APD 604A may include any suitable combination of any suitable semiconductor layers having any suitable doping (e.g., n-doped, p-doped, or intrinsic undoped material). In the example of FIG. 6A, the InGaAs APD 604A includes a p-doped InP layer 620, an InP avalanche layer 622, an absorption layer 624 with n-doped InGaAs or InGaAsP, and an n-doped InP substrate layer 626. Depending on the implementation, the APD 604A may include separate absorption and avalanche layers, or a single layer may act as both an absorption and avalanche region. The APD 604A may operate electrically as a PN diode or a PIN diode, and, during operation, the APD 604A may be reverse-biased with a positive voltage V applied to the lower electrode 608 with respect to the upper electrode 602. The applied reverse-bias voltage V may have any suitable value, such as for example approximately 5 V, 10 V, 20 V, 30 V, 50 V, 75 V, 100 V, or 200 V.

In FIG. 6A, photons of the input light 610 may be absorbed primarily in the absorption layer 624, resulting in the generation of electron-hole pairs (which may be referred to as photo-generated carriers). For example, the absorption layer 624 may be configured to absorb photons corresponding to the operating wavelength of the light detection system in which an optical receiver including the APD 604A operates. For example, the absorption layer 624 may be configured to absorb photons corresponding to the operating wavelength of a lidar system (e.g., the lidar system 800 illustrated in FIG. 8) (e.g., any suitable wavelength between approximately 1400 nm and approximately 1600 nm). In the avalanche layer 622, an avalanche-multiplication process occurs where carriers (e.g., electrons or holes) generated in the absorption layer 624 collide with the semiconductor lattice of the absorption layer 624, and produce additional carriers through impact ionization. This avalanche process can repeat numerous times so that one photo-generated carrier may result in the generation of multiple carriers. As an example, a single photon absorbed in the absorption layer 624 may lead to the generation of approximately 10, 50, 100, 200, 500, 1000, 10,000, or any other suitable number of carriers through an avalanche-multiplication process. The carriers generated in an APD 604A may produce an electrical current that is coupled to an electrical circuit which may perform, for example, signal amplification, sampling, filtering, signal conditioning, analog-to-digital conversion, time-to-digital conversion, pulse detection, threshold detection, rising-edge detection, or falling-edge detection.

The number of carriers generated from a single photo-generated carrier may increase as the applied reverse bias V is increased. If the applied reverse bias V is increased above a particular value referred to as the APD breakdown voltage, then a single carrier can trigger a self-sustaining avalanche process (e.g., the output of the APD 604A is saturated regardless of the input light level). The APD 604A that is operated at or above a breakdown voltage may be referred to as a single-photon avalanche diode (SPAD) and may be referred to as operating in a Geiger mode or a photon-counting mode. The APD 604A that is operated below a breakdown voltage may be referred to as a linear APD, and the output current generated by the APD 604A may be sent to an amplifier circuit (e.g., a transimpedance amplifier). An optical receiver (e.g., an optical receiver 840 illustrated in FIG. 8) may include an APD configured to operate as a SPAD and a quenching circuit configured to reduce a reverse-bias voltage applied to the SPAD when an avalanche event occurs in the SPAD. The APD 604A configured to operate as a SPAD may be coupled to an electronic quenching circuit that reduces the applied voltage V below the breakdown voltage when an avalanche-detection event occurs. Reducing the applied voltage may halt the avalanche process, and the applied reverse-bias voltage may then be re-set to await a subsequent avalanche event. Additionally, the APD 604A may be coupled to a circuit that generates an electrical output pulse or edge when an avalanche event occurs.

In some implementations, the APD 604A along with transimpedance amplifier have a noise-equivalent power (NEP) that is less than or equal to 100 photons, 50 photons, 30 photons, 20 photons, or 10 photons. For example, the APD 604A may be operated as a SPAD and may have a NEP of less than or equal to 20 photons. As another example, the APD 604A may be coupled to a transimpedance amplifier that produces an output voltage signal with a NEP of less than or equal to 50 photons. The NEP of the APD 604A is a metric that quantifies the sensitivity of the APD 604A in terms of a minimum signal (or a minimum number of photons) that the APD 604A can detect. The NEP may correspond to an optical power (or to a number of photons)

that results in a signal-to-noise ratio of 1, or the NEP may represent a threshold number of photons above which an optical signal may be detected. For example, if the APD 604A has a NEP of 20 photons, then the input beam 610 with 20 photons may be detected with a signal-to-noise ratio of approximately 1 (e.g., the APD 604A may receive 20 photons from the input beam 410 and generate an electrical signal representing the input beam 410 that has a signal-to-noise ratio of approximately 1). Similarly, the input beam 610 with 100 photons may be detected with a signal-to-noise ratio of approximately 5. In some implementations, a lidar system including the APD 604A (or a combination of the APD 604A and transimpedance amplifier) having a NEP of less than or equal to 100 photons, 50 photons, 30 photons, 20 photons, or 10 photons offers improved detection sensitivity with respect to a conventional light detection system that uses a PN or PIN photodiode. For example, an InGaAs PIN photodiode used in a conventional lidar system may have a NEP of approximately $10^4$ to $10^5$ photons, and the noise level in a lidar system with an InGaAs PIN photodiode may be $10^3$ to $10^4$ times greater than the noise level in a lidar system 100 with the InGaAs APD detector 604A.

In a front-side illuminated configuration, as shown in FIG. 6A, the APD 604A may be attached to an ASIC, with the bottom surface of the lower electrode 608 facing the ASIC. The lower electrode (i.e., a cathode) may be attached and electrically connected to the ASIC and the upper electrodes (i.e., anodes) can be electrically connected to the ASIC (e.g., via wire bonds).

Alternatively, an APD of this disclosure may be backside illuminated. FIG. 6B illustrates an APD 604B in a back-side illuminated configuration. The APDs 204, 304 shown in FIGS. 2-3 are also back-side illuminated, as illustrated by the active areas 212, 213 located at the bottom surfaces of the APDs 204, 304. The back-side illuminated APD 604B may be similar to the front-side illuminated APD 604A. However, the layers of the APD 604B may be flipped relative to the APD 604A. In particular, the APD 604B may include an n-doped InP substrate layer arranged on top of an absorption layer with n-doped InGaAs or InGaAsP arranged on top of an InP avalanche layer arranged on top of a p-doped InP layer. Thus, in the back-side illuminated APD 604B, a portion of the top surface of the APD 604B receives incident light, which then travels through the APD 604B to reach the active area of the APD 604B. For example, light received at the top surface of the APD 604B travels through a substrate layer (e.g., similar to the layer 626) to reach the active area of the APD 604B, where the active area includes one or more of the semiconductor layers 620, 622, and 624.

As shown in FIG. 6B, the APD 604B is then electrically coupled to an ASIC 602. For example, in the back-side illuminated configuration, the APD 604B is bump-bonded 606 onto the ASIC 602 so that the metal connections do not obscure a received light pulse 610 at the APD 604B, thereby increasing the apparent field of view of the APD 604B. Additionally, bump-bonding lowers capacitance, decreasing the amount of noise at the APD 604B and increasing sensitivity. Bump-bonding refers to a technique where the APD 604B is electrically and mechanically connected to the ASIC 602 by small balls of solder, referred to as bumps or solder bumps. For example, the bumps may be attached to solder pads of the ASIC 602, and the corresponding connectors of the detector package (e.g., similar to the upper electrode 602 but flipped to the bottom of the APD 604B) may then be brought into contact with the bumps.

In some implementations, a lens 630, which may be hemispherical, spherical, concave, convex, etc., may be attached to the APD 604B to focus the received light pulse 610. As an example, the lens 630 may be attached to the front side or the back side of the APD 604B with epoxy or an adhesive (e.g., ultraviolet (UV) cure epoxy or adhesive, or an optically clear adhesive). The lens 630 may be configured to collect and focus input light 610 onto an active area of the APD 604B. In some implementations, a filter 632, such as a notch-filter, may be directly deposited onto the APD 604B or onto the back surface of the lens 632. As an example, after a filter 632 is deposited onto the APD 604B. a lens 630 may be attached to the APD 604B over the filter 632. As another example, after a filter 632 is deposited onto the back surface of the lens 630, the lens 630 may be attached to the APD 604B. In other embodiments, the lens 630 may be attached directly onto the APD 604B.

In a front-side illuminated APD, such as the APD 604B shown in FIG. 6A, the upper electrode 602 may be electrically connected to an ASIC via wire bonds. A filter (not shown), similar to the filter 632, may be placed (e.g., directly deposited via vacuum deposition or monolithic epoxy) onto the APD 604A. Further, a lens (not shown) may be attached to the APD 604A over the filter to focus the received light pulse 610.

A filter placed over the APD 604 (e.g., the filter 632) may be a thin-film notch filter. A notch filter, which may be referred to as a bandpass filter, may include a dichroic coating having a particular combination of high or low reflectivity values at particular wavelengths. In some embodiments, the thin-film notch filter may include a dielectric coating (e.g., a dichroic coating that is anti-reflecting at one or more in-band wavelengths and high-reflecting at out-of-band wavelengths) or a pattern-coated dichroic filter. The thin-film notch filter may have 90% or greater optical transmission at in-band wavelengths matching the operating wavelength of a lidar system including the APD 604 (e.g., having a bandwidth of less than or equal to 40 nm and a center wavelength between approximately 350 nm and 1000 nm for a Si photodetector or between 900 nm and 1700 nm for an InGaAs photodetector) and less than 5% at out-of-band wavelengths (e.g., wavelengths outside of the 40 nm bandwidth centered about the center wavelength and within the operating wavelength range (between 900 nm and 1700 nm for InGaAs or between 350 nm and 1000 nm for Si) of the photodetector).

While the APD 604 is described as an InGaAs APD, which detects light at wavelengths between 900 nm and 1700 nm, this is merely one example for ease of illustration only. The APD 604 may also be a Si APD, which detects light at wavelengths of 350 nm to 1000 nm.

Figure 7:
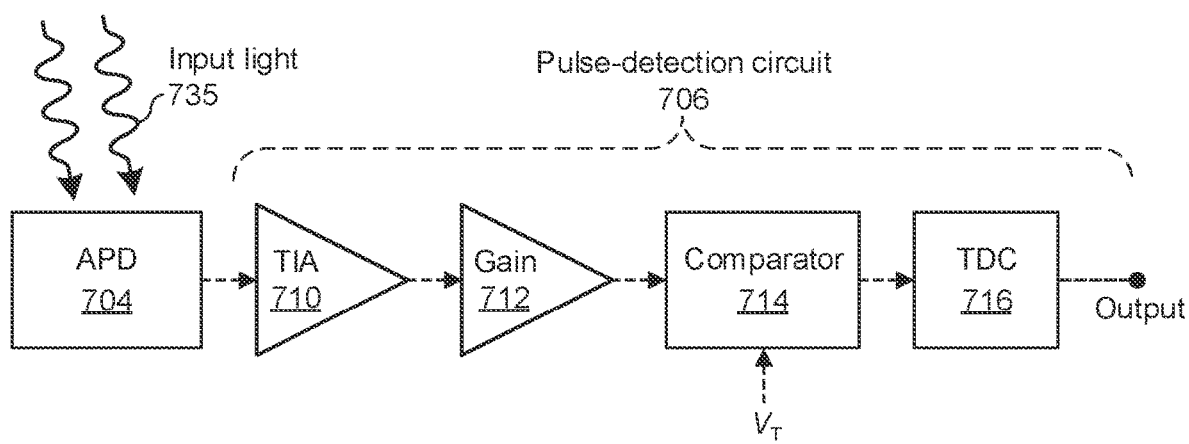
FIG. 7 illustrates an example light detector element coupled to a pulse-detection circuit, where the light detector element can be included in an optical receiver.

FIG. 7 illustrates an APD 704 coupled to a pulse-detection circuit 706. The APD 704 can be similar to the APD 604 discussed with reference to FIGS. 6A-6B, or can be any other suitable light detector. The APD 704 may be coupled to an ASIC, where at least a portion of the ASIC and/or the APD 704 are covered by a protective mask, as discussed above. Part or all of the pulse-detection circuit 706 can be implemented in an ASIC on which the APD 704 is disposed. More generally, the pulse-detection circuit 706 can be implemented in an optical receiver including the APD 704 and the ASIC, in the receiver 840 discussed below with reference to FIG. 8, in sensor heads 912 of a lidar system discussed below with reference to FIG. 9, and/or in any other suitable optical receiver. The pulse-detection circuit 706 alternatively can be implemented in a controller, such as a controller 850 discussed below with reference to FIG. 8, a vehicle controller 922 discussed below with reference to FIG. 9, or another suitable controller. In some implementations, parts of the pulse-detection circuit 706 can operate in a receiver and other parts of the pulse-detection circuit 706 can operate in a controller. For example, components 710 and 712 may be part of a receiver, and components 714 and 716 may be part of a controller.

The pulse-detection circuit 706 may include circuitry that receives a signal from a detector (e.g., an electrical current from the APD 704) and performs current-to-voltage conversion, signal amplification, sampling, filtering, signal conditioning, analog-to-digital conversion, time-to-digital conversion, pulse detection, threshold detection, rising-edge detection, or falling-edge detection. The pulse-detection circuit 706 may determine whether an optical pulse has been received by the APD 704 or may determine a time associated with receipt of an optical pulse by the APD 704. Additionally, the pulse-detection circuit 706 may determine a duration of a received optical pulse. In an example implementation, the pulse-detection circuit 706 includes a transimpedance amplifier (TIA) 710, a gain circuit 712, a comparator 714, and a time-to-digital converter (TDC) 716.

The TIA 710 may be configured to receive an electrical-current signal from the APD 704 and produce a voltage signal that corresponds to the received electrical-current signal. For example, in response to an optical pulse, the APD 704 may produce a current pulse corresponding to the optical pulse. The TIA 710 may receive the current pulse from the APD 704 and produce a voltage pulse that corresponds to the received current pulse. The TIA 710 may also act as an electronic filter. For example, the TIA 710 may be configured as a low-pass filter that removes or attenuates high-frequency electrical noise by attenuating signals above a particular frequency (e.g., above 1 MHz, 10 MHz, 20 MHz, 50 MHz, 100 MHz, 200 MHz, or any other suitable frequency).

The gain circuit 712 (which may include or may be referred to as a voltage amplifier) may be configured to amplify a voltage signal. As an example, the gain circuit 712 may include one or more voltage-amplification stages that amplify a voltage signal received from the TIA 710. For example, the gain circuit 712 may receive a voltage pulse from the TIA 710, and the gain circuit 712 may amplify the voltage pulse by any suitable amount, such as for example, by a gain of approximately 3 dB, 10 dB, 20 dB, 30 dB, 40 dB, or 50 dB. Additionally, the gain circuit 712 may also act as an electronic filter configured to remove or attenuate electrical noise.

In implementations including the TIA 710 followed by the gain circuit 712, the combination of the TIA 710 and the gain circuit 712 may be referred to as an electronic amplifier. In other implementations, the pulse-detection circuit 706 does not include the gain circuit 712, and the TIA 710 may be referred to as an electronic amplifier.

The comparator 714 may be configured to receive a voltage signal from the TIA 710 or the gain circuit 712 and produce an electrical-edge signal (e.g., a rising edge or a falling edge) when the received voltage signal rises above or falls below a particular threshold voltage $V_T$. As an example, when a received voltage rises above $V_T$, the comparator 714 may produce a rising-edge digital-voltage signal (e.g., a signal that steps from approximately 0 V to approximately 2.5 V, 3.3 V, 5 V, or any other suitable digital-high level). As another example, when a received voltage falls below $V_T$, the comparator 714 may produce a falling-edge digital-voltage signal (e.g., a signal that steps down from approximately 2.5 V, 3.3 V, 5 V, or any other suitable digital-high level to approximately 0 V). The voltage signal received by the comparator 714 may be received from the TIA 710 or the gain circuit 712 and may correspond to an electrical-current signal generated by the APD 704. For example, the voltage signal received by the comparator 714 may include a voltage pulse that corresponds to an electrical-current pulse produced by the APD 704 in response to receiving an optical pulse. The voltage signal received by the comparator 714 may be an analog signal, and an electrical-edge signal produced by the comparator 714 may be a digital signal.

The time-to-digital converter (TDC) 716 may be configured to receive an electrical-edge signal from the comparator 714 and determine an interval of time between emission of a pulse of light by the light source and receipt of the electrical-edge signal. The output of the TDC 716 may be a numerical value that corresponds to the time interval determined by the TDC 716. In some implementations, the TDC 516 has an internal counter or clock with any suitable period, such as for example, 5 ps, 10 ps, 15 ps, 20 ps, 30 ps, 50 ps, 100 ps, 0.5 ns, 1 ns, 2 ns, 5 ns, or 10 ns. The TDC 716 for example may have an internal counter or clock with a 20 ps period, and the TDC 716 may determine that an interval of time between emission and receipt of a pulse is equal to 25,000 time periods, which corresponds to a time interval of approximately 0.5 microseconds. The TDC 716 may send the numerical value "25000" to a processor or controller of a lidar system in which the pulse-detection circuit 706 operates (e.g., a controller 850 of the lidar system 800 illustrated in FIG. 8), which may include a processor configured to determine a distance from the lidar system to a target (e.g., a target 830 of FIG. 8) based at least in part on an interval of time determined by a TDC 716. The processor may receive a numerical value (e.g., "25000") from the TDC 716 and, based on the received value, the processor may determine the distance from the light detection system to a target.

FIG. 7 illustrates one comparator-TDC pair including the comparator 714 and the TDC 716. In some implementations, the pulse detection circuit 706 includes several (e.g., 10, 100, or more) parallel comparator-TDC pairs, where each comparator may have a different threshold voltage $V_T$. In such implementations, the output from multiple TDCs, each coupled to a respective comparator, may be used to generate a time of receipt of the pulse and, in turn, the distance from the light detection system to the target.

In some implementations, the gain produced by the gain circuit 712 may vary over time. In general, the gain circuit 712 may use the variable gain to prevent false detection of returned light pulses scattered by remote targets, i.e., false positives. To prevent saturation at the APD 704 (or at the pulse-detection circuit 706) and reduce noise, the gain circuit 712 in an example implementation is configured to operate in a low-gain mode from the time to in which a light pulse is emitted by a light source of the lidar system (e.g., the light source 810) for a threshold time period T1. Time to may be determined in any suitable manner. For example, to initialize the TDC 716 or another TDC, the pulse-detection circuit 706 receives a signal from a controller (e.g., a controller 850 of FIG. 8) or a light source (e.g., a light source 810 of FIG. 8) of the light detection system indicating a light pulse has been emitted. Accordingly, the TDC 716 initializes the clock and the gain circuit 712 operates in the low-gain mode for the threshold time period T1. In another example, the APD 704 and/or the pulse-detection circuit 706 detects light from a light pulse as it is emitted, initializes the clock at the TDC 716, and operates the gain circuit 712 in the low-gain mode for the threshold time period T1. More specifically, the APD 704 and/or the pulse-detection circuit 706 detects light from the light pulse when an optical signal is received at the APD 704 having a value above a threshold amount. The detected light pulse as it is transmitted may be referred to as "optical $t_0$."

In some implementations, varying or adjusting the gain of the gain circuit 712 (which may be referred to as varying or adjusting the gain of the pulse-detection circuit 706) may include varying or adjusting the gain of one or more electrical components in the pulse-detection circuit 706. For example, varying the gain of gain circuit 712 may include one or more of the following: varying the gain of one or more voltage-amplification stages in gain circuit 712; varying the transimpedance gain of TIA 710; or varying both the gain of gain circuit 712 and the transimpedance gain of TIA 710. As another example, varying the gain of the gain circuit 712 may include varying the gain of a voltage amplifier in gain circuit 712 and holding the gain of TIA 710 substantially constant. As another example, varying the gain of the gain circuit 712 may include holding the gain of the gain circuit 712 substantially constant and varying the gain of the TIA 710.

The threshold time period T1 may be configured such that optical signals detected within the threshold time period T1 are indicative of a light pulse as it is emitted rather than scattered and returned to the receiver or indicative of a returned light pulse scattered by a target within a minimum range (e.g., 1 m). More specifically, the threshold time period T1 may be greater than or equal to the time-of-flight corresponding to the minimum range (e.g., 6.66 ns for a minimum range of 1 m).

Upon expiration of the threshold time period T1, the gain circuit 712 is configured to operate in a high-gain mode for a threshold time period T2. The threshold time period T2 may be configured to last from expiration of the threshold time period T1 until the time in which a subsequent pulse is transmitted. For example, when a light source of the lidar system (e.g., the light source 810) produces pulses at a pulse-repetition frequency of approximately 750 kHz corresponding to a pulse period of 1.33 μs and a maximum range of 200 m, the threshold time period T2 may be from T1 (e.g., 6.66 ns from $t_0$) to 1.33 μs from $t_0$. Then, when a subsequent light pulse is emitted by the light source, the gain circuit 712 is configured to return to the low-gain mode for another threshold time period T1. In an example implementation, the low-gain mode may have a gain of 3 dB while the high-gain mode has a gain of 50 dB.

In other implementations, the gain is configured to gradually increase over time from the time a light pulse is transmitted until a subsequent light pulse is transmitted, at which point the gain circuit 712 returns to the original gain from when the initial light pulse is transmitted. In yet other implementations, the gain may be held at a fixed gain value during the threshold time period T1, and then the gain may be gradually increased over time during the threshold time period T2.

In any event, as mentioned above, the amplified signal from the gain circuit 712 is then provided to a comparator 714 configured to compare the amplified signal to a threshold voltage $V_T$. When the amplified signal rises above $V_T$, the pulse-detection circuit 706 determines that a received optical signal from the APD 704 is indicative of a returned light pulse scattered by a remote target.

Figure 8:
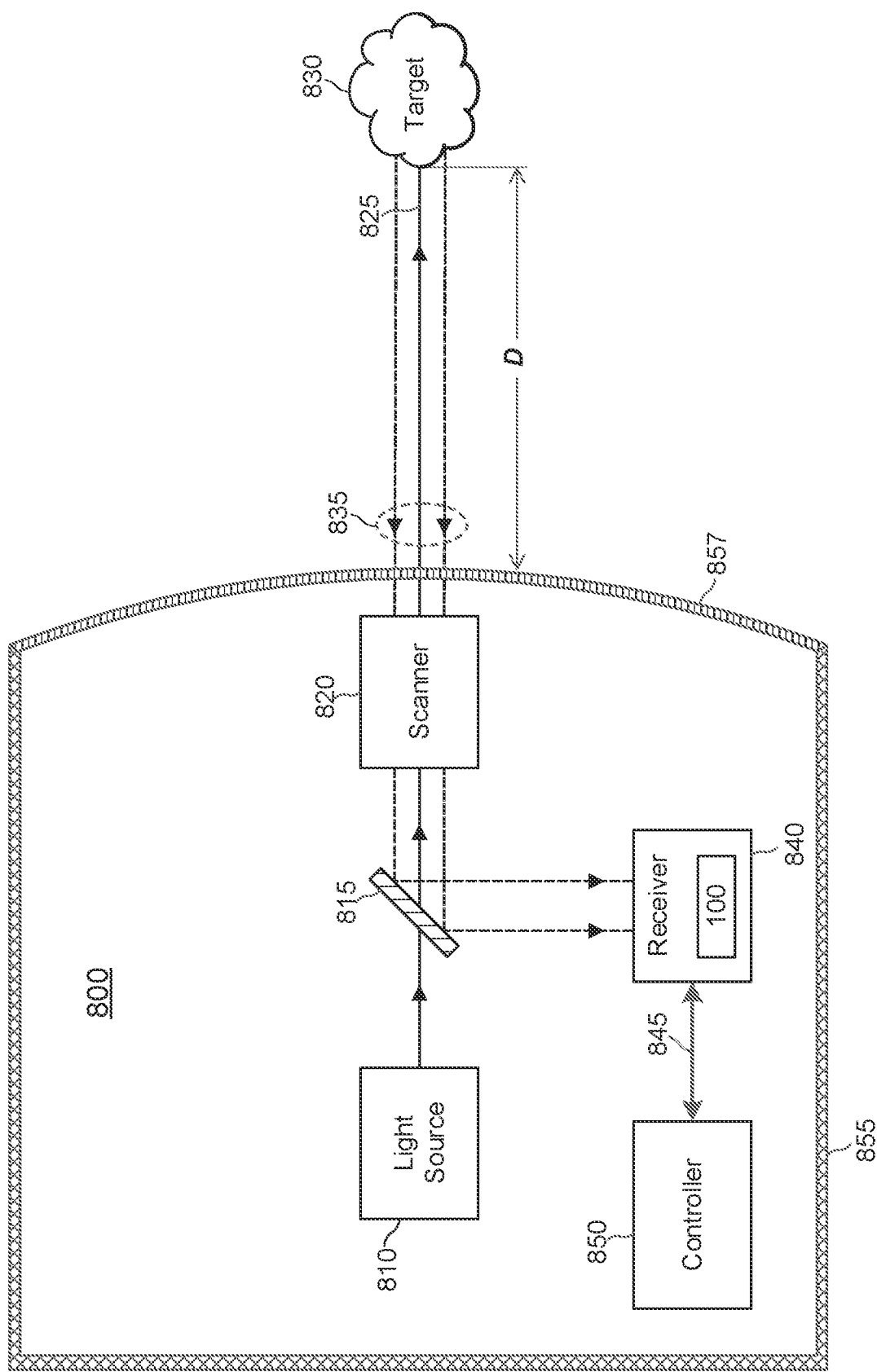
FIG. 8 illustrates an example light detection and ranging (lidar) system in which an optical receiver can operate.

FIG. 8 illustrates an example lidar system 800 in which an optical receiver of this disclosure can operate. In particular, the portion 100 of the example optical receiver illustrated by FIG. 1 may be included in the receiver 840 of the lidar system 800. This disclosure describes the protective mask primarily with reference to using the protective mask in an optical receiver of a lidar system. However, the protective mask described herein may be used in any light detection system(s) to protect hardware of the light detection system from light-induced damage without interfering with the optical path of incoming light to light detection elements.

The example lidar system 800 may include a light source 810, a mirror 815, a scanner 820, a receiver 840 (i.e., an optical receiver), and a controller 850. The light source 810 may be, for example, a laser (e.g., a laser diode) that emits light having a particular operating wavelength in the infrared, visible, or ultraviolet portions of the electromagnetic spectrum. In operation, the light source 810 emits an output beam of light 825 which may be continuous-wave, pulsed, or modulated in any suitable manner for a given application. The output beam of light 225 is directed downrange toward a remote target 830 located a distance D from the lidar system 800 and at least partially contained within a field of regard of the system 800.

Once the output beam 825 reaches the downrange target 830, the target 830 may scatter or, in some cases, reflect at least a portion of light from the output beam 825, and some of the scattered or reflected light may return toward the lidar system 800. In the example of FIG. 8, the scattered or reflected light is represented by input beam 835, which passes through the scanner 820, which may be referred to as a beam scanner, optical scanner, or laser scanner. The input beam 835 passes through the scanner 820 to the mirror 815, which may be referred to as an overlap mirror, superposition mirror, or beam-combiner mirror. The mirror 815 in turn directs the input beam 835 to the receiver 840.

The input beam 835 may include light from the output beam 825 that is scattered by the target 830, light from the output beam 825 that is reflected by the target 830, or a combination of scattered and reflected light from target 830. According to some implementations, the lidar system 800 can include an "eye-safe" laser that present little or no possibility of causing damage to a person's eyes. The input beam 835 may contain only a relatively small fraction of the light from the output beam 825.

The receiver 840 may receive or detect photons from the input beam 835 and generate one or more representative signals. For example, the receiver 840 may generate an output electrical signal 845 that is representative of the input beam 835. The receiver may send the electrical signal 845 to the controller 850. Depending on the implementation, the controller 850 may include one or more instruction-executing processors, an application-specific integrated circuit (ASIC), a field-programmable gate array (FPGA), and/or other suitable circuitry configured to analyze one or more characteristics of the electrical signal 845 in order to determine one or more characteristics of the target 830, such as its distance downrange from the lidar system 800. More particularly, the controller 850 may analyze the time of flight or phase modulation for the beam of light 825 transmitted by the light source 810. If the lidar system 800 measures a time of flight of T (e.g., T representing a round-trip time of flight for an emitted pulse of light to travel from the lidar system 800 to the target 830 and back to the lidar system 800), then the distance D from the target 830 to the lidar system 800 may be expressed as $D = c \cdot T/2$, where c is the speed of light (approximately $3.0 \times 10^8$ m/s).

The distance D from the lidar system 800 is less than or equal to a maximum range $R_{MAX}$ of the lidar system 800. The maximum range $R_{MAX}$ (which also may be referred to as a maximum distance) of a lidar system 800 may correspond to the maximum distance over which the lidar system 800 is configured to sense or identify targets that appear in a field of regard of the lidar system 800. The maximum range of lidar system 800 may be any suitable distance, such as 50 m, 200 m, 500 m, or 1 km, for example.

In some implementations, the light source 810, the scanner 820, and the receiver 840 may be packaged together within a single housing 855, which may be a box, case, or enclosure that holds or contains all or part of the lidar system 800. The housing 855 includes a window 857 through which the beams 825 and 835 pass. The controller 850 may reside within the same housing 855 as the components 810, 820, and 840, or the controller 850 may reside outside of the housing 855. In some implementations, the housing 855 includes multiple lidar sensors, each including a respective scanner and a receiver. Depending on the particular implementation, each of the multiple sensors can include a separate light source or a common light source. The multiple sensors can be configured to cover non-overlapping adjacent fields of regard or partially overlapping fields of regard, for example, depending on the implementation.

With continued reference to FIG. 8, the output beam 825 and input beam 835 may be substantially coaxial. In other words, the output beam 825 and input beam 835 may at least partially overlap or share a common propagation axis, so that the input beam 835 and the output beam 825 travel along substantially the same optical path (albeit in opposite directions). As the lidar system 800 scans the output beam 825 across a field of regard, the input beam 835 may follow along with the output beam 825, so that the coaxial relationship between the two beams is maintained.

Generally speaking, the scanner 820 steers the output beam 825 in one or more directions downrange. To accomplish this, the scanner 820 may include one or more scanning mirrors and one or more actuators driving the mirrors to rotate, tilt, pivot, or move the mirrors in an angular manner about one or more axes, for example. While FIG. 8 depicts only a single mirror 815, the lidar system 800 may include any suitable number of flat or curved mirrors (e.g., concave, convex, or parabolic mirrors) to steer or focus the output beam 825 or the input beam 835. For example, the first mirror of the scanner may scan the output beam 825 along a first direction, and the second mirror may scan the output beam 825 along a second direction that is substantially orthogonal to the first direction.

A "field of regard" of the lidar system 800 may refer to an area, region, or angular range over which the lidar system 800 may be configured to scan or capture distance information. When the lidar system 800 scans the output beam 825 within a 30-degree scanning range, for example, the lidar system 800 may be referred to as having a 30-degree angular field of regard. The scanner 820 may be configured to scan the output beam 825 horizontally and vertically, and the field of regard of the lidar system 800 may have a particular angular width along the horizontal direction and another particular angular width along the vertical direction. For example, the lidar system 800 may have a horizontal field of regard of 10° to 120° and a vertical field of regard of 2° to 45°.

The one or more scanning mirrors of the scanner 820 may be communicatively coupled to the controller 850, which may control the scanning mirror(s) so as to guide the output beam 825 in a desired direction downrange or along a desired scan pattern. In general, a scan (or scan line) pattern may refer to a pattern or path along which the output beam 825 is directed. The lidar system 800 can use the scan pattern to generate a point cloud with points or "pixels" that substantially cover the field of regard. The pixels may be approximately evenly distributed across the field of regard, or distributed according to a particular non-uniform distribution.

In operation, the light source 810 may emit pulses of light which the scanner 820 scans across a field of regard of the lidar system 800. The target 830 may scatter one or more of the emitted pulses, and the receiver 840 may detect at least a portion of the pulses of light scattered by the target 830. The receiver 840 may receive or detect at least a portion of the input beam 835 and produce an electrical signal that corresponds to the input beam 835. The receiver 840 may include a protective mask (e.g., one of the masks 116, 216, 316, 416) placed over an ASIC having a light detector disposed thereon. The protective mask is placed so that at least a portion of the input beam 835 steered by the mirror 815 can travel through the aperture in the protective mask to an active area of the light detector.

Referring briefly to FIGS. 6A-6B, an optical filter may be located in front of the receiver 840 and configured to transmit light at one or more operating wavelengths of the light source 810 and attenuate light at surrounding wavelengths. For example, an optical filter may be a free-space spectral filter located in front of the receiver 840 including the APD 604 of FIGS. 6A-6B. This spectral filter may transmit light at the operating wavelength of the light source 810 (e.g., between approximately 1530 nm and 1560 nm) and attenuate light outside that wavelength range. As a more specific example, light with wavelengths of approximately 400-1530 nm or 1560-2000 nm may be attenuated by any suitable amount, such as for example, by at least 5 dB, 10 dB, 20 dB, 30 dB, or 40 dB.

Turning back to FIG. 8, the controller 850 may be electrically coupled or otherwise communicatively coupled to one or more of the light source 810, the scanner 820, and the receiver 840. The controller 850 may provide instructions, a control signal, or a trigger signal to the light source 810 indicating when the light source 810 should produce optical pulses, and possibly characteristics (e.g., duration, period, peak power, wavelength, etc.) of the pulses. The controller 850 may also determine a time-of-flight value for an optical pulse based on timing information associated with when the pulse was emitted by light source 810 and when a portion of the pulse (e.g., the input beam 835) was detected or received by the receiver 840.

As indicated above, the lidar system 800 may be used to determine the distance to one or more downrange targets 830. By scanning the lidar system 800 across a field of regard, the system can be used to map the distance to a number of points within the field of regard. Each of these depth-mapped points may be referred to as a pixel or a voxel. A collection of pixels captured in succession (which may be referred to as a depth map, a point cloud, or a point cloud frame) may be rendered as an image or may be analyzed to identify or detect objects or to determine a shape or distance of objects within the field of regard. For example, a depth map may cover a field of regard that extends 60° horizontally and 15° vertically, and the depth map may include a frame of 100-2000 pixels in the horizontal direction by 4-400 pixels in the vertical direction.

The lidar system 800 may be configured to repeatedly capture or generate point clouds of a field of regard at any suitable frame rate between approximately 0.1 frames per second (FPS) and approximately 1,000 FPS, for example. The point cloud frame rate may be substantially fixed or dynamically adjustable, depending on the implementation. In general, the lidar system 800 can use a slower frame rate (e.g., 1 Hz) to capture one or more high-resolution point clouds, and use a faster frame rate (e.g., 10 Hz) to rapidly capture multiple lower-resolution point clouds.

The field of regard of the lidar system 800 can overlap, encompass, or enclose at least a portion of the target 830, which may include all or part of an object that is moving or stationary relative to lidar system 800. For example, the target 830 may include all or a portion of a person, vehicle, motorcycle, truck, train, bicycle, wheelchair, pedestrian, animal, road sign, traffic light, lane marking, road-surface marking, parking space, pylon, guard rail, traffic barrier, pothole, railroad crossing, obstacle in or near a road, curb, stopped vehicle on or beside a road, utility pole, house, building, trash can, mailbox, tree, any other suitable object, or any suitable combination of all or part of two or more objects.

Figure 9:
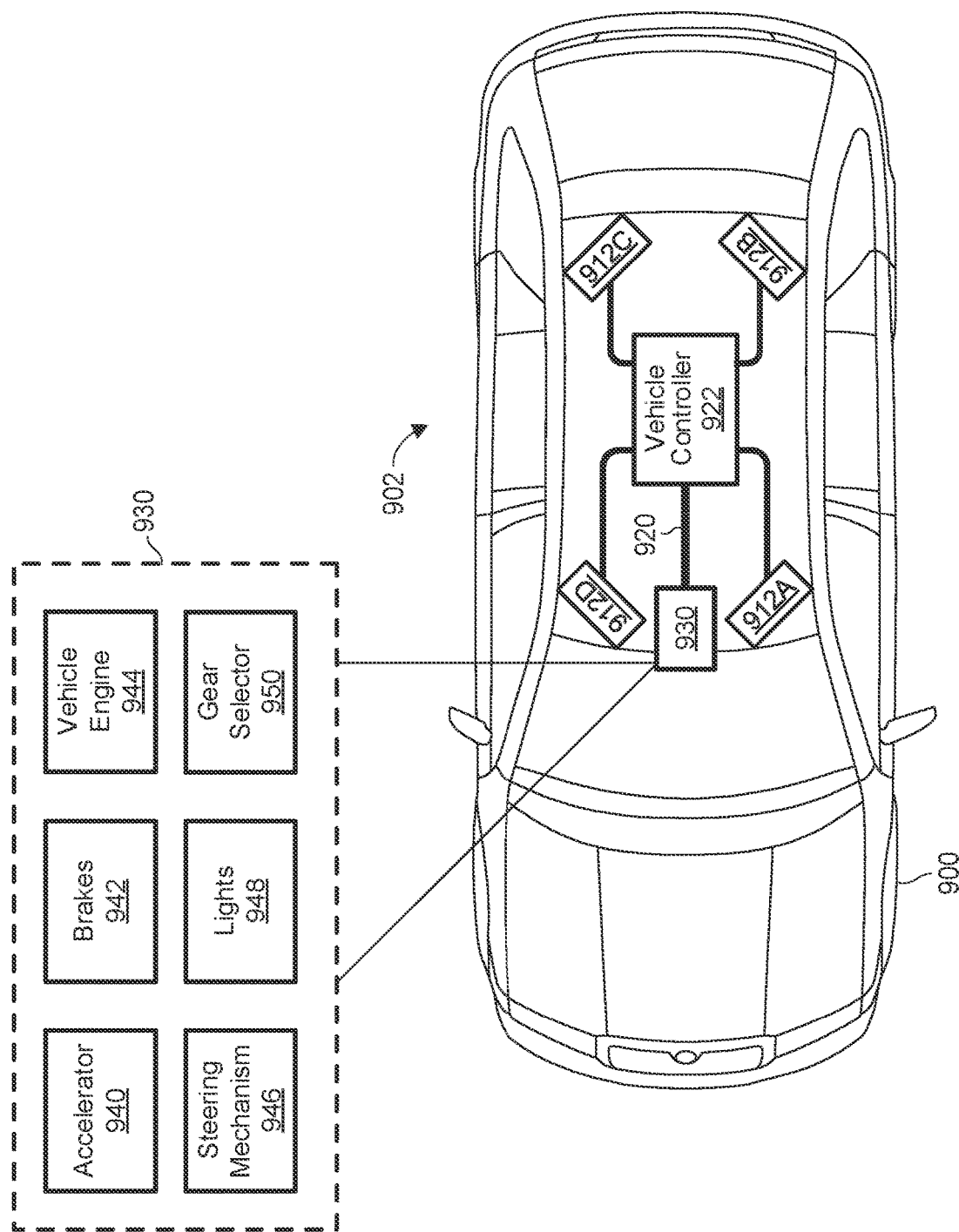
FIG. 9 illustrates an example vehicle in which the lidar system of FIG. 8 can operate.

FIG. 9 illustrates an example vehicle 900 with a lidar system 902. The lidar system 902 includes multiple sensor heads 912A-912D, each of which is equipped with a respective laser. Alternatively, the sensor heads 912A-D can be coupled to a single laser via suitable laser-sensor links. In general, each of the sensor heads 912 may include some or all of the components of the lidar system 800 illustrated in FIG. 8.

The sensor heads 912 in FIG. 9 are positioned or oriented to provide a greater than 30-degree view of an environment around the vehicle. More generally, a lidar system with multiple sensor heads may provide a horizontal field of regard around a vehicle of approximately 30°, 45°, 60°, 90°, 120°, 180°, 270°, or 360°. Each of the sensor heads 912 may be attached to, or incorporated into, a bumper, fender, grill, side panel, spoiler, roof, headlight assembly, taillight assembly, rear-view mirror assembly, hood, trunk, window, or any other suitable part of the vehicle.

In the example of FIG. 9, four sensor heads 912 are positioned at or near the four corners of the vehicle (e.g., each of the sensor heads 912 may be incorporated into a light assembly, side panel, bumper, or fender). Each of the four sensor heads 912 may include a laser, or the sensor heads 912 may be coupled to a single laser, which may be located within the vehicle 900 (e.g., in or near the trunk). The four sensor heads 912 may each provide a 90° to 120° horizontal field of regard (FOR), and the four sensor heads 912 may be oriented so that together they provide a complete 360-degree view around the vehicle. As another example, the lidar system 902 may include six sensor heads 912 positioned on or around the vehicle 900, where each of the sensor heads 912 provides a 60° to 90° horizontal FOR. As another example, the lidar system 902 may include eight sensor heads 912, and each of the sensor heads 912 may provide a 45° to 60° horizontal FOR. As yet another example, the lidar system 902 may include six sensor heads 912, where each of the sensor heads 912 provides a 70° horizontal FOR with an overlap between adjacent FORs of approximately 10°. As another example, the lidar system 902 may include two sensor heads 912 which together provide a forward-facing horizontal FOR of greater than or equal to 30°.

Data from each of the sensor heads 912 may be combined or stitched together to generate a point cloud that covers a greater than or equal to 30-degree horizontal view around a vehicle. In implementations in which a single laser is coupled to the sensor heads 912, the laser may include a controller or processor that receives data from each of the sensor heads 912 (e.g., via a corresponding electrical link 320) and processes the received data to construct a point cloud covering a 360-degree horizontal view around a vehicle or to determine distances to one or more targets. The point cloud or information from the point cloud may be provided to a vehicle controller 922 via a corresponding electrical, optical, or radio link 920. The vehicle controller 922 may include one or more CPUs, GPUs, and a non-transitory memory with persistent components (e.g., flash memory, an optical disk) and/or non-persistent components (e.g., RAM).

Thus, in some implementations, the point cloud is generated by combining data from each of the multiple sensor heads 912 at a controller included within a laser coupled to the sensor heads 912, and is provided to the vehicle controller 922. In other implementations, each of the sensor heads 912 includes a controller or processor that constructs a point cloud for a portion of the 360-degree horizontal view around the vehicle and provides the respective point cloud to the vehicle controller 922. The vehicle controller 922 then combines or stitches together the point clouds from the respective sensor heads 912 to construct a combined point cloud covering a 360-degree horizontal view. Still further, the vehicle controller 922 in some implementations communicates with a remote server to process point cloud data.

In any event, the vehicle 900 may be an autonomous vehicle where the vehicle controller 922 provides control signals to various components 930 within the vehicle 900 to maneuver and otherwise control operation of the vehicle 900. The components 930 are depicted in an expanded view in FIG. 9 for ease of illustration only. The components 930 may include an accelerator 940, brakes 942, a vehicle engine 944, a steering mechanism 946, lights 948 such as brake lights, head lights, reverse lights, emergency lights, etc., and/or a gear selector 950. Depending on the implementation, the components 930 may include additional components, such as an inertial measurement unit (IMU) 343, additional sensors 345 (e.g., cameras, radars, acoustic sensors, atmospheric pressure sensors, moisture sensors, ambient light sensors, as indicated below), and/or other suitable components that effectuate and control movement of the vehicle 900. The gear selector 950 may include the park, reverse, neutral, drive gears, etc. Each of the components 930 may include an interface via which the component receives commands from the vehicle controller 922 such as "increase speed," "decrease speed," "turn left 5 degrees," "activate left turn signal," etc. and, in some cases, provides feedback to the vehicle controller 922.

In some implementations, the vehicle controller 922 receives point cloud data from the sensor heads 912 via the links 920 and analyzes the received point cloud data to sense or identify targets 830 (see FIG. 8) and their respective locations, distances, speeds, shapes, sizes, type of target (e.g., vehicle, human, tree, animal), etc. The vehicle controller 922 then provides control signals via another link 920 to the components 930 to control operation of the vehicle based on the analyzed information.

In addition to the lidar system 902, the vehicle 300 may also be equipped with other sensors such as a camera, a thermal imager, a conventional radar (none illustrated to avoid clutter), etc. The sensors can provide additional data to the vehicle controller 922 via wired or wireless communication links. Further, the vehicle 900 in an example implementation includes a microphone array operating as a part of an acoustic source localization system configured to determine sources of sounds.

Figure 10:
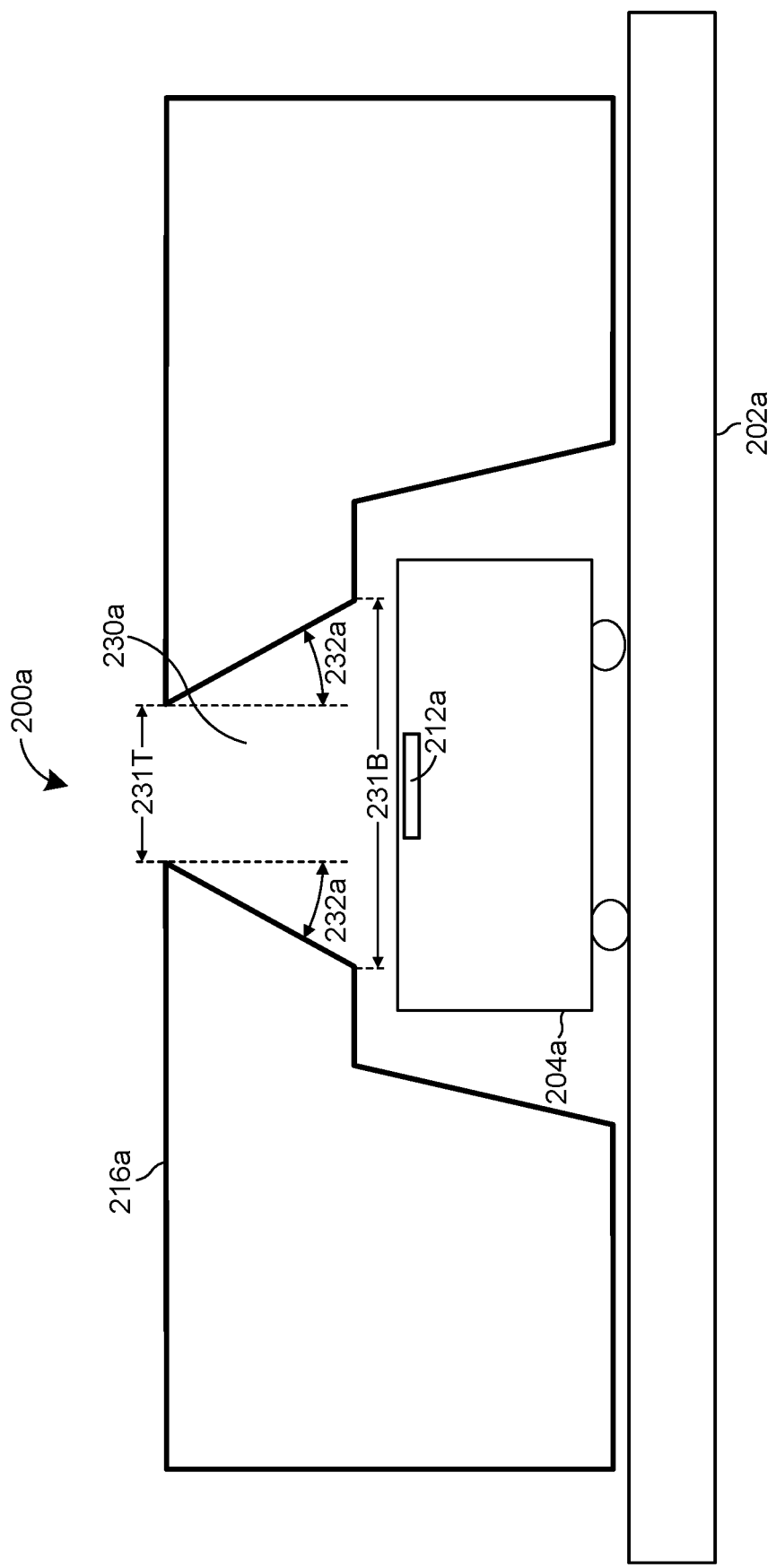
FIG. 10 illustrates a side view of an example optical receiver.

FIG. 10 illustrates a side view of an example optical receiver 200a. The optical receiver 200a includes a protective mask 216a with an aperture 230a, a light detector element 204a with an active area 212a, and an ASIC 202a. The active area 212a is located at or near the top surface of the light detector 204a (rather than at or near the bottom surface, as illustrated in FIG. 2).

The protective mask 216a in FIG. 10 is similar to the protective mask 216 in FIG. 2, except the protective mask 216a has an aperture 230a that is inverted with respect to the aperture 230 in FIG. 2. In FIG. 10, the aperture 230a has an opening on the bottom surface of the mask 216a that is larger than an opening on the top surface of the mask 216a. The dimension 231B represents a length, width, or diameter of the opening on the bottom surface of the mask 216a, and the dimension 231T represents a corresponding length, width, or diameter of the opening on the top surface of the mask 216a. The opening on the bottom surface of the mask 216a being larger than the opening on the top surface of the mask 216a corresponds to the dimension 231B being greater than the dimension 231T. The aperture 230a in FIG. 10 may be referred to as having a conical shape.

An aperture 230a may have one or more sides located between the bottom and top openings, where the one or more sides have an angle of 20-45 degrees with respect to vertical. In FIG. 10, each of the left and right sides of the aperture 230a has an angle 232a of approximately 30 degrees with respect to the vertical direction, where the vertical direction is indicated by a dashed line. The vertical direction corresponds to a direction orthogonal to a plane of the mask 216a or a plane of the ASIC 202a.

Figure 11:
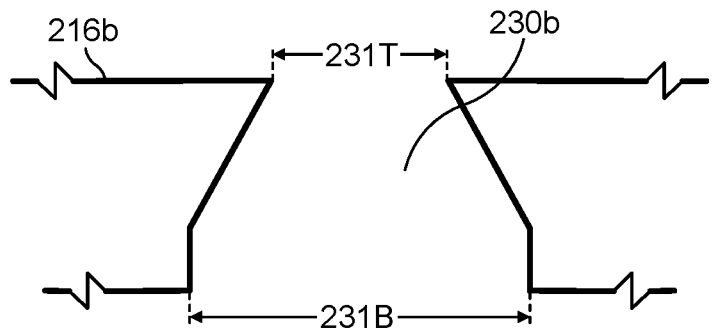
FIGS. 11-13 each illustrates a side view of an example aperture of a protective mask.
Figure 12:
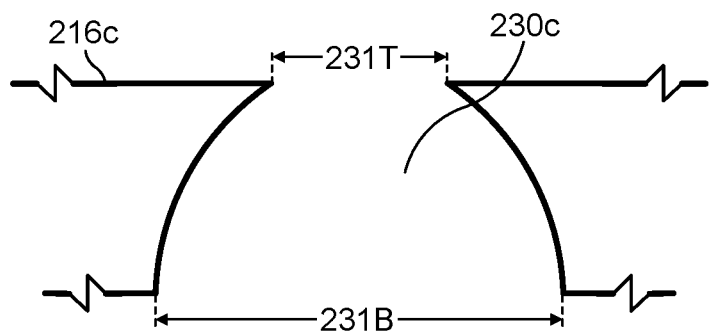
Figure 13:
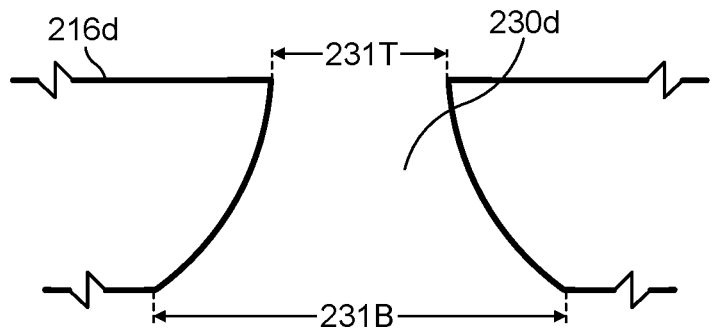

FIGS. 11-13 each illustrates a side view of an example aperture of a protective mask. An aperture may have a side that includes a linear shape or a curved shape. The aperture 230a in FIG. 10 has a side with a linear shape. A side of an aperture may have a piecewise-linear shape that includes two or more linear segments. The mask 216b in FIG. 11 has an aperture 230b with a piecewise-linear side that includes two linear segments. A side of an aperture may have a curved shape. The mask 216c in FIG. 12 has an aperture 230c with a concave curved shape. The mask 216d in FIG. 13 has an aperture 230d with a convex curved shape.

FIGS. 14-17 each illustrates a top view of an example aperture of a protective mask. The outline of the top-surface opening of the aperture is represented by a solid line, and the outline of the bottom-surface opening of the aperture is represented by a dashed line. In each of FIGS. 14-17, the bottom-surface opening of the aperture is larger than the top-surface opening of the aperture, as indicated by a length, width, or diameter of the opening on the bottom surface being greater than a corresponding length, width, or diameter of the opening on the top surface. The length, width, or diameter of an opening may have any suitable value. For example the length, width, or diameter of a bottom-surface opening (e.g., as represented by 231B, 231B-x, or 231B-y) may be between 100 μm and 1,000 μm. Additionally, the corresponding length, width, or diameter of a top-surface opening (e.g., as represented by 231T, 231T-x, or 231T-y) may be between 25 μm and 600 μm, where the bottom-surface dimension is greater than the corresponding top-surface dimension (e.g., 231B-y is greater than 231T-y). An opening may have any suitable shape, such as an approximately circular, elliptical, square, or rectangular shape.

Figure 14:
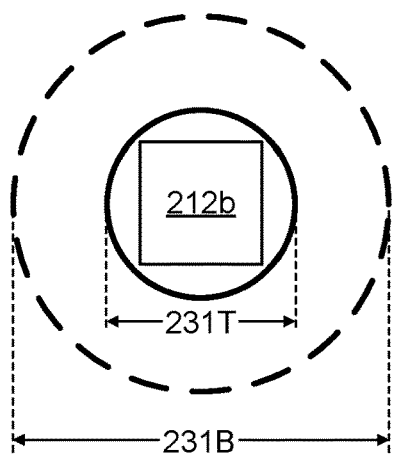
FIGS. 14-17 each illustrates a top view of an example aperture of a protective mask.

The aperture 230e in FIG. 14 has circular openings with a light detector 212b located approximately centered within the openings. The top-surface opening has a diameter of 231T, and the bottom-surface opening has a diameter of 231B, where the diameter 231B is greater than the diameter 231T. For example, 231B may be approximately 500 μm, and 231T may be approximately 250 μm.

Figure 15:
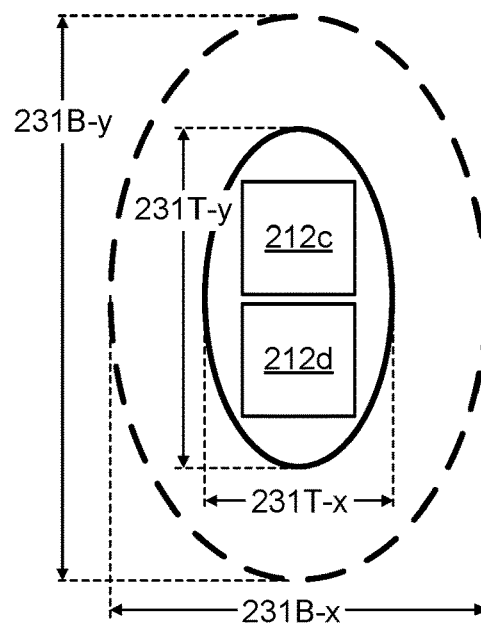

The aperture 230f in FIG. 15 has elliptical openings with two light detectors 212c and 212d positioned within the openings. The top elliptical opening has a length of 231T-y along the major axis and a length of 231T-x along the minor axis. The bottom elliptical opening has a length of 231B-y along the major axis and a length of 231B-x along the minor axis. The bottom elliptical opening is larger than the top elliptical opening as indicated by (i) 231B-y being greater than 231T-y and (ii) 231B-x being greater than 231T-x. For example, 231B-y may be approximately 800 μm, and 231T-y may be approximately 500 μm. Additionally, 231B-x may be approximately 400 μm, and 231T-x may be approximately 250 μm. In some embodiments, the top or bottom opening may be approximately circular (e.g., an ellipse with equal lengths along the major and minor axes), while the other opening is elliptical. For example, the bottom opening may be approximately circular with 231B-x and 231B-y being approximately equal, while the top opening is elliptical with 231T-x and 231T-y having different values. As an example, 231B-x and 231B-y may each be approximately 500 μm, while 231T-x and 231T-y are 200 μm and 400 μm, respectively.

Figure 16:
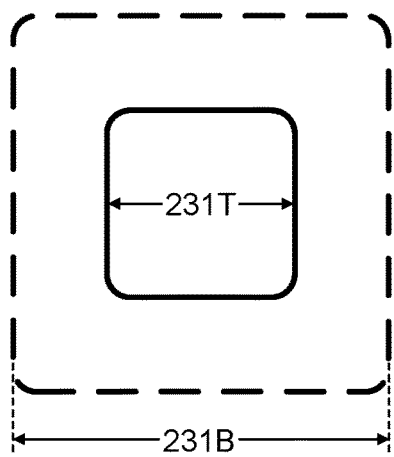

The aperture 230g in FIG. 16 has square openings with rounded corners. The top square opening has a side length of 231T, and the bottom square opening has a side length of 231B, where length 231B is greater than length 231T. For example, 231B may be approximately 200 μm, and 231T may be approximately 75 μm.

Figure 17:
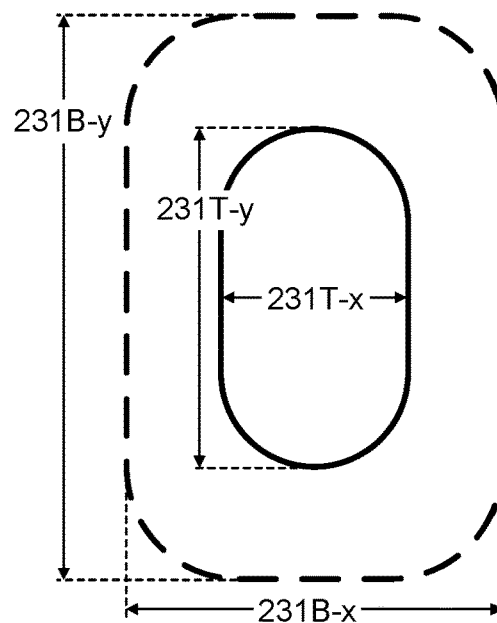

The aperture 230h in FIG. 17 has rectangular openings with rounded corners. The top rectangular opening has a length of 231T-y and a width of 231T-x. The bottom rectangular opening has a length of 231B-y and a width of 231B-x. The bottom rectangular opening is larger than the top rectangular opening as indicated by (i) 231B-y being greater than 231T-y and (ii) 231B-x being greater than 231T-x. For example, 231B-y may be approximately 1,000 μm, and 231T-y may be approximately 600 μm. Additionally, 231B-x may be approximately 400 μm, and 231T-x may be approximately 200 μm. In some embodiments, the top or bottom opening may be approximately square (e.g., a rectangle with equal length and width), while the other opening is rectangular.

The apertures in one or more of FIGS. 2, 3, and 10-17 may be referred to as having a conical shape. A conical shape, which may be referred to as a truncated cone or as a frustrum, may be formed by the top and bottom openings and the sides of an aperture. Aperture 230e in FIG. 14 may be referred to as a circular cone, a circular truncated cone, or a circular frustrum. Aperture 230f in FIG. 15 may be referred to as an elliptical cone, an elliptical truncated cone, or an elliptical frustrum. Aperture 230g in FIG. 16 may be referred to as a square cone, a square truncated cone, or a square frustrum. Aperture 230h in FIG. 17 may be referred to as a rectangular cone, a rectangular truncated cone, or a rectangular frustrum.

An optical receiver may include two or more light detectors arranged along a line, and a mask for the optical receiver may have an aperture with top and bottom openings that are elongated along the line of detectors. In the example of FIG. 15, the underlying optical receiver includes two light detectors 212c and 212d arranged in the optical path provided by the aperture 230f, and the aperture 230f has two elliptical openings that are oriented with their major axes along a line connecting the centers of the two light detectors. An optical receiver may include any suitable number of light detectors arranged along a line, such as for example, 2, 3, 4, 5, 10, 50, 100, 500, or 1,000 light detectors arranged in a line. The active areas of the two or more light detectors may be arranged in the optical path provided by a single aperture of a protective mask.

Figure 18:
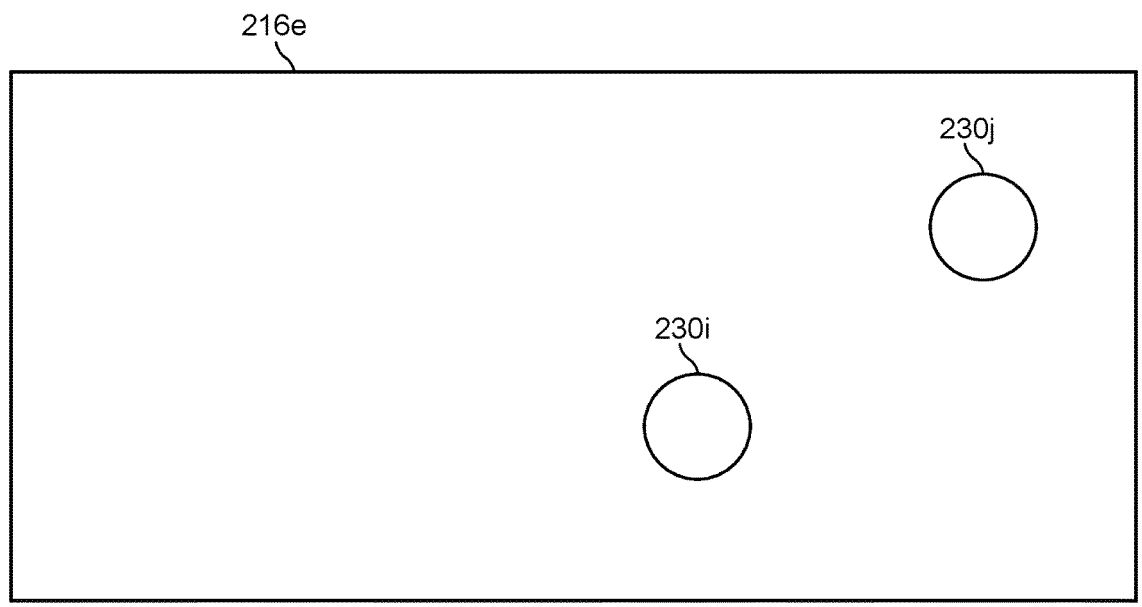
FIG. 18 illustrates a top view of an example protective mask with two apertures.

FIG. 18 illustrates a top view of an example protective mask 216e with two apertures 230i and 230j. In some embodiments, a protective mask may include two or more apertures, each aperture corresponding to one or more light detectors mounted onto an ASIC. The mask 216e in FIG. 18 includes two apertures 230i and 230j, and each aperture may provide an optical path for one or more light detectors located on an ASIC.

FIG. 19 illustrates a side view of an example optical receiver 200e that includes the protective mask 216e of FIG. 18. The optical receiver 200e includes a protective mask 216e with two apertures 230i and 230j, two light detector elements 204i and 204j (where each light detector element includes a respective active area 212i and 212j), and an ASIC 202e. Each of the apertures 230i and 230j has a conical shape with a bottom-surface opening that is larger than a top-surface opening. Each of the apertures 230i and 230j defines an optical path for a beam of incident light through the mask 216e to an active area of a light detector. Aperture 230i defines an optical path for light beam 132i to active area 212i of light detector 204i, and aperture 230j defines an optical path for light beam 132j to active area 212j of light detector 204j. In FIG. 19, each aperture is associated with one light detector. In other embodiments, a mask may include two or more apertures, where each aperture is associated with two or more light detectors. The optical receiver 200e may be part of a lidar system that emits two output beams, and each light detector may receive scattered light from one of the two output beams, where the received scattered light is represented by light beams 132i and 132j.

Optical cross-talk, which is generally undesirable in an optical receiver, may refer to an amount of light intended for one light detector that is incident on another light detector. The apertures 230i and 230j of mask 216e may provide for a reduction in the amount of optical cross-talk between the light detectors 204i and 204j. Optical cross-talk from light detector 204i to 204j may refer to an amount of light from light beam 132i that is incident on active area 212j. Similarly, optical cross-talk from light detector 204j to 204i may refer to an amount of light from light beam 132j that is incident on active area 212i. The mask 216e may provide for a reduction of 10 dB or greater in optical cross-talk as compared to an optical receiver without a mask. For example, without a mask, 1% of the light from light beam 132i may be detected by light detector 204j (which corresponds to −20 dB of optical cross-talk), and 1% of the light from light beam 132j may be detected by light detector 204i. With the mask 216e in place, less than 0.1% of the light from light beam 132i may be detected by light detector 204j (which corresponds to less than −30 dB of optical cross-talk), and less than 0.1% of the light from light beam 132j may be detector by light detector 204i. This reduction from 1% cross-talk to less than 0.1% cross talk corresponds to a greater than 10-dB (or 10×) reduction in optical cross-talk provided by the mask 216e. As another example, if light beam 132i includes a pulse of light with $10^6$ photons, then, without a mask, 1,000 photons may be detected by light detector 204j (which corresponds to −30 dB of optical cross-talk). With the mask 216e in place, 10 photons from the pulse of light may be detected by light detector 204j (which corresponds to −50 dB of optical cross-talk). This reduction of optical cross-talk from −30 dB to −50 dB corresponds to a 20-dB (or 100×) reduction in optical cross-talk provided by the mask 216e. A mask may provide for a reduction in optical cross-talk of any suitable amount, such as for example, a reduction in optical cross-talk of greater than 10 dB, 20 dB, 30 dB, or 40 dB.

General Considerations

In some cases, a computing device may be used to implement various modules, circuits, systems, methods, or algorithm steps disclosed herein. As an example, all or part of a module, circuit, system, method, or algorithm disclosed herein may be implemented or performed by a general-purpose single- or multi-chip processor, a digital signal processor (DSP), an ASIC, a FPGA, any other suitable programmable-logic device, discrete gate or transistor logic, discrete hardware components, or any suitable combination thereof. A general-purpose processor may be a microprocessor, or, any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In particular embodiments, one or more implementations of the subject matter described herein may be implemented as one or more computer programs (e.g., one or more modules of computer-program instructions encoded or stored on a computer-readable non-transitory storage medium). As an example, the steps of a method or algorithm disclosed herein may be implemented in a processor-executable software module which may reside on a computer-readable non-transitory storage medium. In particular embodiments, a computer-readable non-transitory storage medium may include any suitable storage medium that may be used to store or transfer computer software and that may be accessed by a computer system. Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs (e.g., compact discs (CDs), CD-ROM, digital versatile discs (DVDs), blue-ray discs, or laser discs), optical disc drives (ODDs), magneto-optical discs, magneto-optical drives, floppy diskettes, floppy disk drives (FDDs), magnetic tapes, flash memories, solid-state drives (SSDs), RAM, RAM-drives, ROM, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

In some cases, certain features described herein in the context of separate implementations may also be combined and implemented in a single implementation. Conversely, various features that are described in the context of a single implementation may also be implemented in multiple implementations separately or in any suitable sub-combination. Moreover, although features may be described above as acting in certain combinations and even initially claimed as such, one or more features from a claimed combination may in some cases be excised from the combination, and the claimed combination may be directed to a sub-combination or variation of a sub-combination.

While operations may be depicted in the drawings as occurring in a particular order, this should not be understood as requiring that such operations be performed in the particular order shown or in sequential order, or that all operations be performed. Further, the drawings may schematically depict one more example processes or methods in the form of a flow diagram or a sequence diagram. However, other operations that are not depicted may be incorporated in the example processes or methods that are schematically illustrated. For example, one or more additional operations may be performed before, after, simultaneously with, or between any of the illustrated operations. Moreover, one or more operations depicted in a diagram may be repeated, where appropriate. Additionally, operations depicted in a diagram may be performed in any suitable order. Furthermore, although particular components, devices, or systems are described herein as carrying out particular operations, any suitable combination of any suitable components, devices, or systems may be used to carry out any suitable operation or combination of operations. In certain circumstances, multitasking or parallel processing operations may be performed. Moreover, the separation of various system components in the implementations described herein should not be understood as requiring such separation in all implementations, and it should be understood that the described program components and systems may be integrated together in a single software product or packaged into multiple software products.

Various implementations have been described in connection with the accompanying drawings. However, it should be understood that the figures may not necessarily be drawn to scale. As an example, distances or angles depicted in the figures are illustrative and may not necessarily bear an exact relationship to actual dimensions or layout of the devices illustrated.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes or illustrates respective embodiments herein as including particular components, elements, functions, operations, or steps, any of these embodiments may include any combination or permutation of any of the components, elements, functions, operations, or steps described or illustrated anywhere herein that a person having ordinary skill in the art would comprehend.

The term "or" as used herein is to be interpreted as an inclusive or meaning any one or any combination, unless expressly indicated otherwise or indicated otherwise by context. Therefore, herein, the expression "A or B" means "A, B, or both A and B." As another example, herein, "A, B or C" means at least one of the following: A; B; C; A and B; A and C; B and C; A, B and C. An exception to this definition will occur if a combination of elements, devices, steps, or operations is in some way inherently mutually exclusive.

As used herein, words of approximation such as, without limitation, "approximately, "substantially," or "about" refer to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skill in the art recognize the modified feature as having the required characteristics or capabilities of the unmodified feature. In general, but subject to the preceding discussion, a numerical value herein that is modified by a word of approximation such as "approximately" may vary from the stated value by ±0.5%, ±1%, ±2%, ±3%, ±4%, ±5%, ±10%, ±12%, or ±15%.

As used herein, the terms "first," "second," "third," etc. may be used as labels for nouns that they precede, and these terms may not necessarily imply a particular ordering (e.g., a particular spatial, temporal, or logical ordering). As an example, a system may be described as determining a "first result" and a "second result," and the terms "first" and "second" may not necessarily imply that the first result is determined before the second result.

As used herein, the terms "based on" and "based at least in part on" may be used to describe or present one or more factors that affect a determination, and these terms may not exclude additional factors that may affect a determination. A determination may be based solely on those factors which are presented or may be based at least in part on those factors. The phrase "determine A based on B" indicates that B is a factor that affects the determination of A. In some instances, other factors may also contribute to the determination of A. In other instances, A may be determined based solely on B.

What is claimed is:

1. An optical receiver comprising:
   an application-specific integrated circuit (ASIC);
   a light detector element with a top surface oriented toward incident light, the top surface including a portion configured to receive the incident light and via which the incident light reaches an active area of the light detector element, the light detector element disposed on the ASIC; and
   a protective mask placed over the ASIC so as to (i) cover, from the incident light, at least a portion of the ASIC, and (ii) provide an aperture that defines an optical path for the incident light through the protective mask to the portion of the top surface of the light detector element, wherein the aperture in the protective mask comprises:
   (i) an opening on a top surface of the protective mask oriented toward the incident light, and
   (ii) an opening on a bottom surface of the protective mask oriented toward the light detector element, wherein the opening on the bottom surface is larger than the opening on the top surface, wherein a length, width, or diameter of the opening on the bottom surface is greater than a corresponding length, width, or diameter of the opening on the top surface, and wherein the length, width, or diameter of the opening on the bottom surface is between 100 micrometers and 1,000 micrometers, and the corresponding length, width, or diameter of the opening on the top surface is between 25 micrometers and 600 micrometers.

2. The optical receiver of claim 1, wherein each of the openings on the top and bottom surfaces has a substantially circular, elliptical, square, or rectangular shape.

3. The optical receiver of claim 1, wherein the aperture has a conical shape.

4. The optical receiver of claim 1, wherein a side of the aperture has an angle of 20 to 45 degrees with respect to vertical.

5. The optical receiver of claim 1, wherein a side of the aperture includes a linear shape or a curved shape.

6. The optical receiver of claim 1, wherein:
   the light detector element is a first light detector element, and the active area is a first active area;
   the optical receiver further includes a second light detector element having a second active area; and the first and the second active areas are in the optical path provided by the aperture.

7. The optical receiver of claim 1, wherein a center of the aperture is substantially aligned with a center of the active area.

8. The optical receiver of claim 1, wherein the protective mask includes a first portion attached to the ASIC and a second portion recessed relative to the first portion to define a cavity that accommodates the light detector element.

9. The optical receiver of claim 1, wherein the active area is the portion of the top surface of the light detector element.

10. The optical receiver of claim 1, wherein the active area is located below the portion of the top surface of the light detector element, such that the incident light travels from the portion of the top surface through at least a portion of the light detector element to the active area.

11. The optical receiver of claim 1, wherein a thickness of the protective mask is between 200 and 1,000 micrometers.

12. The optical receiver of claim 1, wherein the protective mask is made of a ceramic material.

13. The optical receiver of claim 1, wherein the protective mask absorbs, reflects, or scatters light at wavelengths to which the light detector element is sensitive.

14. The optical receiver of claim 1, wherein the protective mask is opaque to light with a wavelength between approximately 1500 nanometers and 1600 nanometers.

15. The optical receiver of claim 1, wherein the protective mask has a laser-induced damage threshold above 10 joules per square centimeter.

16. The optical receiver of claim 1, wherein the light detector element is an avalanche photodiode (APD).

17. A lidar system comprising:
a light source configured to emit pulses of light;
a scanner configured to scan the emitted pulses of light across a field of regard of the lidar system;
an optical receiver configured to detect incident light including a portion of one of the emitted pulses of light scattered by a target located a distance from the lidar system, the optical receiver comprising:
an application-specific integrated circuit (ASIC);
a light detector element with a top surface oriented toward the incident light, the top surface including a portion configured to receive the incident light and via which the incident light reaches an active area of the light detector element, the light detector element disposed on the ASIC; and
a protective mask placed over the ASIC so as to (i) cover, from the incident light, at least a portion of the ASIC, and (ii) provide an aperture that defines an optical path for the incident light through the protective mask to the portion of the top surface of the light detector element, wherein the aperture in the protective mask comprises (i) an opening on a top surface of the protective mask oriented toward the incident light and (ii) an opening on a bottom surface of the protective mask oriented toward the light detector element, wherein the opening on the bottom surface is larger than the opening on the top surface, wherein a length, width, or diameter of the opening on the bottom surface is greater than a corresponding length, width, or diameter of the opening on the top surface, and wherein the length, width, or diameter of the opening on the bottom surface is between 100 micrometers and 1,000 micrometers, and the corresponding length, width, or diameter of the opening on the top surface is between 25 micrometers and 600 micrometers; and a processor configured to determine the distance to the target based on a round-trip time of the portion of the emitted pulse of light, the round-trip time corresponding to a time between when the portion of the emitted pulse of light is emitted by the light source and when the portion of the emitted pulse of light is detected by the optical receiver.

18. An optical receiver comprising:
an application-specific integrated circuit (ASIC);
a first light detector element with a top surface oriented toward a first beam of incident light, the top surface including a portion configured to receive the first beam of incident light and via which the first beam of incident light reaches a first active area of the first light detector element, the first light detector element disposed on the ASIC;
a second light detector element having a second active area, the second light detector element configured to receive a second beam of incident light;
a protective mask placed over the ASIC so as to:
cover, from the first beam of incident light, at least a portion of the ASIC;
provide a first aperture that defines an optical path for the first beam of incident light through the protective mask to the portion of the top surface of the first light detector element, wherein the first aperture in the protective mask comprises (i) an opening on a top surface of the protective mask oriented toward the first beam of incident light, and (ii) an opening on a bottom surface of the protective mask oriented toward the first light detector element, wherein the opening on the bottom surface is larger than the opening on the top surface; and
provide a second aperture that defines a second optical path for the second beam of incident light through the protective mask to the second active area of the second light detector element.

19. The optical receiver of claim 18, wherein the first and second apertures are configured so that optical cross-talk between the first and second light detector elements is reduced by greater than 10 dB with respect to an optical receiver without a protective mask.

20. The optical receiver of claim 18, wherein each of the openings on the top and bottom surfaces has a substantially circular, elliptical, square, or rectangular shape.

21. The optical receiver of claim 18, wherein the first aperture has a conical shape.

22. The optical receiver of claim 18, wherein a side of the first aperture has an angle of 20 to 45 degrees with respect to vertical.

23. The optical receiver of claim 18, wherein a center of the first aperture is substantially aligned with a center of the first active area.

24. The optical receiver of claim 18, wherein the first active area is located below the portion of the top surface of the first light detector element, such that the first beam of incident light travels from the portion of the top surface through at least a portion of the first light detector element to the first active area.

25. The optical receiver of claim 18, wherein the protective mask is opaque to light with a wavelength between approximately 1500 nanometers and 1600 nanometers.

26. The optical receiver of claim 18, wherein the protective mask has a laser-induced damage threshold above 10 joules per square centimeter.

27. The optical receiver of claim 18, wherein the first light detector element is an avalanche photodiode (APD).

28. An optical receiver comprising:

an application-specific integrated circuit (ASIC);

a light detector element with a top surface oriented toward incident light, the top surface including a portion configured to receive the incident light and via which the incident light reaches an active area of the light detector element, the light detector element disposed on the ASIC, wherein:

the incident light includes a received pulse of light;

the light detector element is configured to produce a pulse of electrical current corresponding to the received pulse of light; and the ASIC includes:

an electronic amplifier configured to amplify the pulse of electrical current to produce a voltage pulse that corresponds to the pulse of electrical current;

one or more comparators, wherein each comparator is coupled to the electronic amplifier and configured to produce an electrical-edge signal when the voltage pulse rises above or falls below a particular threshold voltage; and one or more time-to-digital converters (TDCs), wherein each TDC is coupled to one of the one or more comparators and is configured to produce a time value corresponding to a time when the electrical-edge signal was received by the TDC, wherein a time of receipt for the received pulse of light is determined based on one or more time values produced by one or more of the TDCs; and a protective mask placed over the ASIC so as to (i) cover, from the incident light, at least a portion of the ASIC, and (ii) provide an aperture that defines an optical path for the incident light through the protective mask to the portion of the top surface of the light detector element, wherein the aperture in the protective mask comprises (i) an opening on a top surface of the protective mask oriented toward the incident light and (ii) an opening on a bottom surface of the protective mask oriented toward the light detector element, wherein the opening on the bottom surface is larger than the opening on the top surface.

29. The optical receiver of claim 28, wherein the electronic amplifier includes (i) a transimpedance amplifier or (ii) a transimpedance amplifier followed by a voltage amplifier.

30. The optical receiver of claim 28, wherein each of the openings on the top and bottom surfaces has a substantially circular, elliptical, square, or rectangular shape.

31. The optical receiver of claim 28, wherein the aperture has a conical shape.

32. The optical receiver of claim 28, wherein a side of the aperture has an angle of 20 to 45 degrees with respect to vertical.

33. The optical receiver of claim 28, wherein a center of the aperture is substantially aligned with a center of the active area.

34. The optical receiver of claim 28, wherein the active area is located below the portion of the top surface of the light detector element, such that the incident light travels from the portion of the top surface through at least a portion of the light detector element to the active area.

35. The optical receiver of claim 28, wherein the protective mask is opaque to light with a wavelength between approximately 1500 nanometers and 1600 nanometers.

36. The optical receiver of claim 28, wherein the protective mask has a laser-induced damage threshold above 10 joules per square centimeter.

37. The optical receiver of claim 28, wherein the light detector element is an avalanche photodiode (APD).

* * * * *